United States Patent
Chung et al.

(10) Patent No.: US 7,858,450 B2
(45) Date of Patent: Dec. 28, 2010

(54) OPTIC MASK AND MANUFACTURING METHOD OF THIN FILM TRANSISTOR ARRAY PANEL USING THE SAME

(75) Inventors: Ui-Jin Chung, Suwon-si (KR); Myung-Koo Kang, Seoul (KR); Jae-Bok Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1544 days.

(21) Appl. No.: 11/029,011

(22) Filed: Jan. 5, 2005

(65) Prior Publication Data
US 2005/0173752 A1 Aug. 11, 2005

(30) Foreign Application Priority Data
Jan. 6, 2004 (KR) .................. 10-2004-0000547
Jan. 16, 2004 (KR) .................. 10-2004-0003216

(51) Int. Cl.
*H01L 21/00* (2006.01)
*H01L 21/84* (2006.01)

(52) U.S. Cl. .................. 438/149; 438/155; 438/164; 257/E21.125; 257/E31.041

(58) Field of Classification Search ............ 438/47–48, 438/96, 97, 149, 159, 160, 365, 473, 795, 438/798; 257/359, 581, E27.1, E27.125, 257/E29.117, E31.041
See application file for complete search history.

(56) References Cited

U.S. PATENT DOCUMENTS

| 5,888,675 | A | | 3/1999 | Moore et al. |
| 5,956,581 | A | * | 9/1999 | Yamazaki et al. ............ 438/166 |
| 2001/0055830 | A1 | * | 12/2001 | Yoshimoto .................... 438/48 |
| 2002/0009818 | A1 | * | 1/2002 | Yoshimoto .................... 438/30 |
| 2003/0008215 | A1 | | 1/2003 | Mukherjee |
| 2003/0061984 | A1 | * | 4/2003 | Maekawa et al. .............. 117/4 |
| 2003/0092275 | A1 | * | 5/2003 | Yang .......................... 438/700 |
| 2003/0153182 | A1 | * | 8/2003 | Yamazaki et al. ............ 438/689 |
| 2004/0134417 | A1 | * | 7/2004 | Kim ............................ 117/89 |
| 2004/0161913 | A1 | * | 8/2004 | Kawasaki et al. ............ 438/487 |
| 2004/0266078 | A1 | * | 12/2004 | Kim ............................ 438/166 |

FOREIGN PATENT DOCUMENTS

| CN | 1421935 | 6/2003 |
| CN | 1435813 | 8/2003 |
| CN | 1454332 | 11/2003 |

* cited by examiner

*Primary Examiner*—Alexander G Ghyka
*Assistant Examiner*—Abdulfattah Mustapha
(74) *Attorney, Agent, or Firm*—F. Chau & Associates, LLC

(57) ABSTRACT

An optic mask for crystallizing amorphous silicon comprises a first slit region including a plurality of slits regularly arranged for defining incident region of laser beam, wherein the slits of the first slit region are formed to slope by a predetermined angle to the direction of transfer of the optic mask in crystallization process, and wherein the slits of the first slit region includes a first slit having a first length and a second slit having a second length which is longer than the first length.

17 Claims, 27 Drawing Sheets

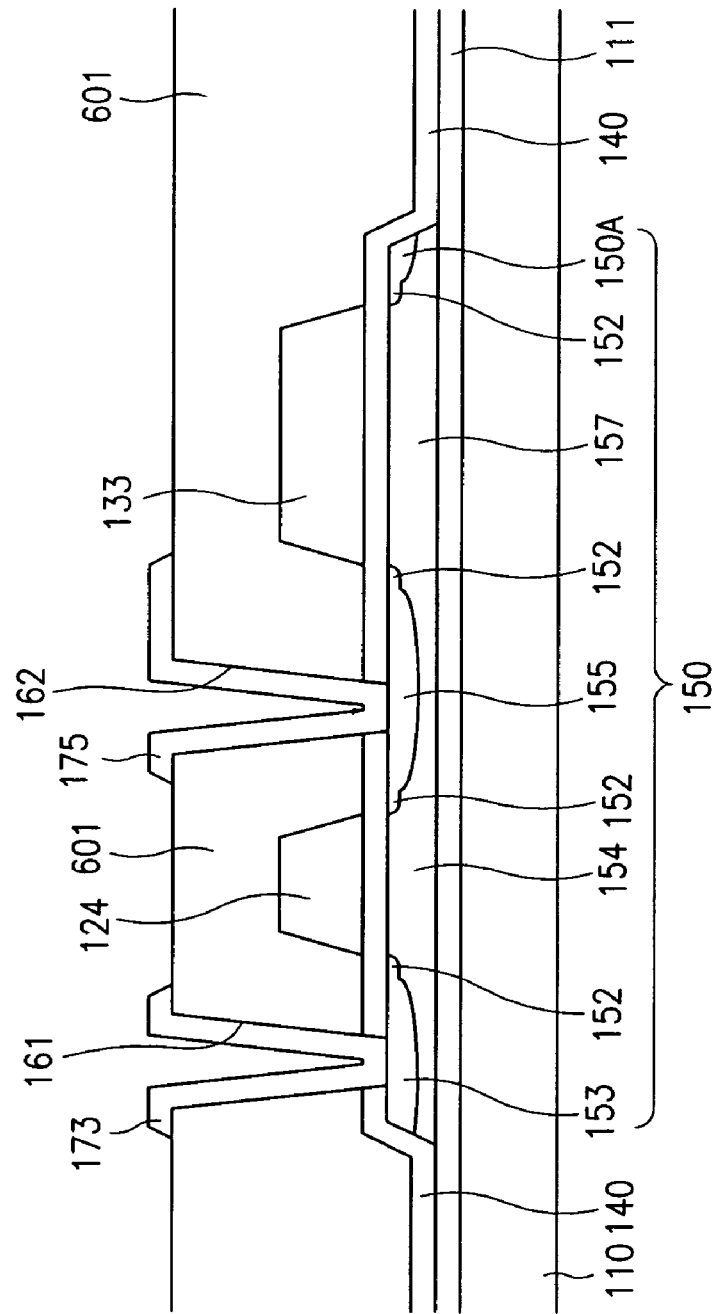

OPTIC MASK AND MANUFACTURING METHOD OF THIN FILM TRANSISTOR ARRAY PANEL USING THE SAME

CROSS REFERENCE

This application claims the benefit of Korean Patent Application No. 10-2004-000547, filed on Jan. 6, 2004 and Korean Patent Application No. 10-2004-003216, filed on Jan. 16, 2004, which is hereby incorporated by reference for all purposes as if fully set forth herein.

1. Field of the Invention

The present invention relates to an optic mask for crystallizing amorphous silicon into poly crystalline silicon and a method for manufacturing a thin film transistor array panel using the same.

2. Description of the Related Art

Generally, silicon is divided into amorphous silicon and crystalline silicon according to the state of crystal. Amorphous silicon is widely used in display having glasses whose melting point is low, since amorphous silicon film can be fabricated at a low temperature.

However, the amorphous silicon film has low carrier mobility. It may be unsuitable for applying to a high quality driving circuit of display panels. Whereas, since polycrystalline silicon has prominent electric field effect mobility, high frequency operation, and low leakage current, high quality driving circuits require the polycrystalline silicon.

Excimer laser annealing (ELA) and chamber annealing are typical methods for producing polycrystalline silicon. Recently, sequential lateral solidification (SLS) process is proposed. The SLS technique utilizes a phenomenon that the silicon grains grow laterally to the boundary of a liquid region and a solid region.

SUMMARY OF THE INVENTION

The present invention provides an optic mask for crystallizing silicon that is enhancing the uniformity of characteristics of thin film transistors, and a method of manufacturing a thin film transistor array panel using the same.

According to one aspect of the present invention, an optic mask for crystallizing amorphous silicon comprises a first slit region including a plurality of slits regularly arranged for defining incident region of laser beam, wherein the slits of the first slit region are inclined by a predetermined angle to the direction of transfer of the optic mask in crystallization process, and wherein the slits of the first slit region includes a first slit having a first length and a second slit having a second length which is longer than the first length.

Here, it is preferable that the second length is longer than the first length by the margin of misalignment of the optic mask.

The optic mask may further comprises a second slit region including a plurality of slits regularly arranged for defining incident region of laser beam, wherein the slits of the first silt region are arranged to deviate from the slits of the second slit region.

According to another aspect of the present invention, a method of manufacturing a thin film transistor comprises forming an amorphous silicon layer on an insulating substrate, forming a polycrystalline silicon layer by irradiating a laser beam to the amorphous silicon layer through an optic mask that includes a first slit of a first length and a second slit of a second length and translating the laser beam and the optic mask, forming a semiconductor layer by patterning the poly silicon layer, forming a gate insulating layer over the semiconductor layer, forming a gate line on the gate insulating layer to overlap the semiconductor layer partially, forming a source region and a drain region by doping conductive impurities of high concentration on predetermined regions of the semiconductor layer, forming a first interlayer insulating layer over the gate line and the semiconductor layer, forming a data line including a source electrode connected with the source region and forming a drain electrode connected with the drain region, forming a second interlayer insulating layer on the data line and the drain electrode, and forming a pixel electrode on the second interlayer insulating layer to be connected with the drain electrode.

According to another aspect of the present invention, a method of manufacturing a thin film transistor comprises the steps of: forming an amorphous silicon layer on an insulating substrate, forming a polycrystalline silicon layer by irradiating a laser beam to the amorphous silicon layer through an optic mask which includes a first slit of a first length and a second slit of a second length and translating the laser beam and the optic mask, forming a semiconductor layer by patterning the poly silicon layer, forming a gate insulating layer over the semiconductor layer, forming a data metal piece and a gate line that has a portion overlapping the semiconductor layer, forming a source region and a drain region by doping conductive impurities of high concentration on predetermined regions of the semiconductor layer, forming an interlayer insulating layer over the semiconductor layer, and forming a data connection part connected with the source region and the data metal piece, and a pixel electrode connected with the drain region.

Here, the manufacturing method can further comprise forming LDD regions in the semiconductor layer by doping conductive impurities having a lower concentration compared to the source region and the drain region.

The manufacturing method can further comprise forming a blocking layer between the insulating substrate and the semiconductor layer.

At this time, the slits are formed to slope by as much as a predetermined angle to the direction of transfer of the optic mask.

The optic mask includes a first slit region and a second slit region that individually include the first slit and the second slit, and wherein the slits of the first slit region and the slit of the second slit region are arranged to deviate from each other.

The present invention provides an optic mask for crystallizing amorphous silicon comprises slits that are transparent area of laser beam and have curved boundary line.

Here, the slits may have a shape of arc.

The present invention provides a method of manufacturing a thin film transistor comprising: forming an amorphous silicon layer on an insulating substrate; forming a polycrystalline silicon layer by crystallizing the amorphous silicon layer; forming a semiconductor layer by patterning the poly silicon layer; forming a gate insulating layer on the semiconductor layer; forming a gate electrode on the gate insulating layer to overlap the semiconductor layer partially; forming a source region and a drain region on both sides of the gate electrode to define a channel region therebetween; forming a first interlayer insulating layer on the gate electrode; forming a source and drain electrodes respectively connected to the source region and the drain region; forming a second interlayer insulating layer on the drain electrode; and forming a pixel electrode on the second interlayer insulating layer to be connected with the drain electrode, wherein the step of forming a polycrystalline silicon layer is performed by a SLS and grain groups formed by the SLS have boundaries deviating from the boundary of the channel region.

Here, the SLS may be performed with using an optic mask having slits that are transparent area of laser beam and have curved boundary line. The slits may have a shape of arc. The mask may have two regions having a plurality of slits that are arranged in a row and the slits of the two regions are arranged to deviate from each other. The method may further includes a step of forming LDDs disposed between the channel region and the source and drain regions.

BRIEF DESCRIPTION OF THE DRAWINGS

FIG. 8B is a cross-sectional view taken along the line VIIIB-VIIIB' of FIG. 8A.

DETAILED DESCRIPTION OF THE PREFERRED EMBODIMENTS

Figure 1:
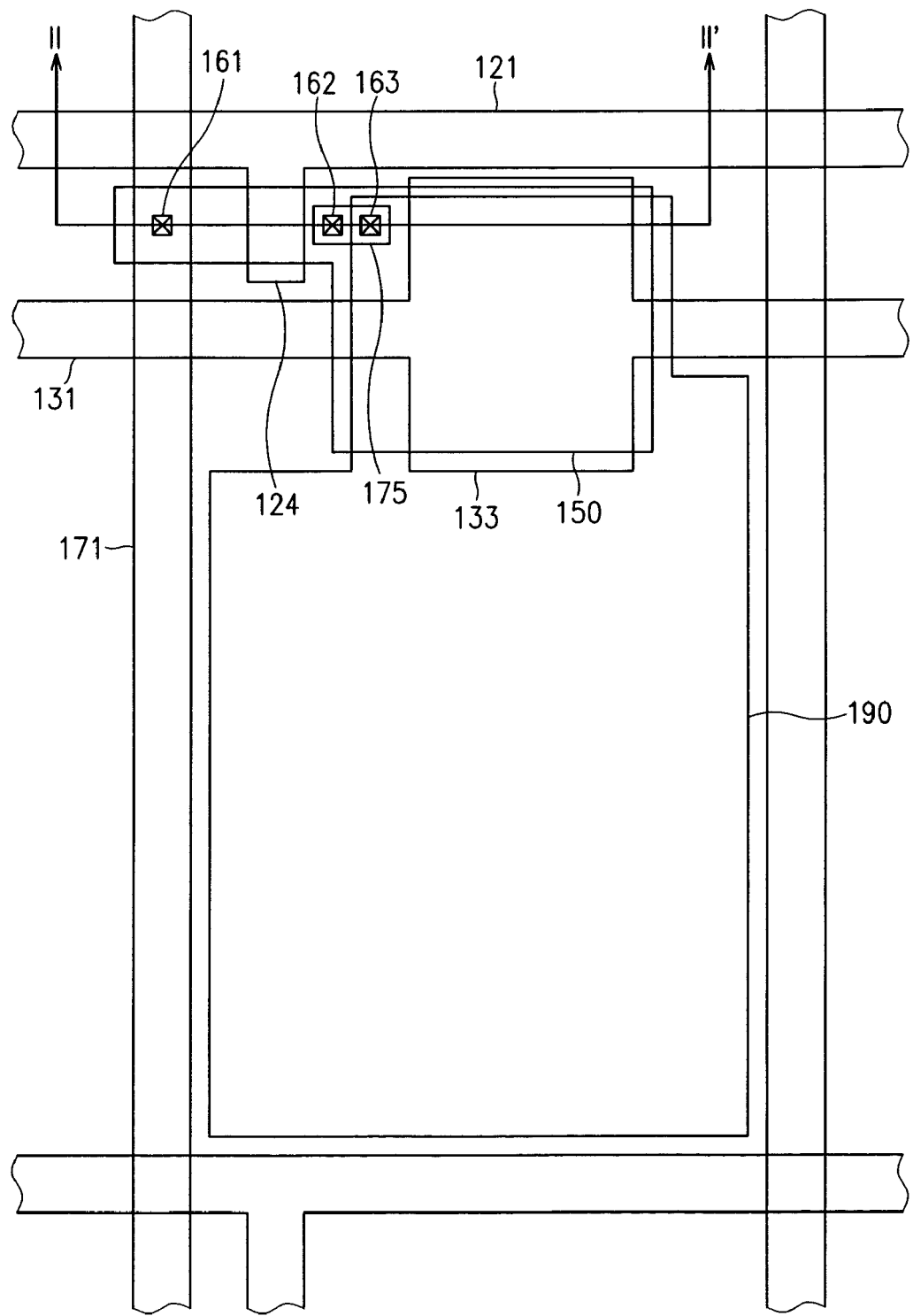
FIG. 1 is a plan view of a TFT array panel according to an embodiment of the present invention.

Preferred embodiments of the present invention will now be described hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of the layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Hereinafter, TFT array panels and methods of manufacturing the same according to preferred embodiments of the present invention will be described with reference to the accompanying drawings.

Optic masks for crystallization according to the preferred embodiments of the present invention include first slits having a first length and second slits having a second length. This will be described in the description of manufacturing methods of a TFT array panel.

Embodiment 1

Figure 2:
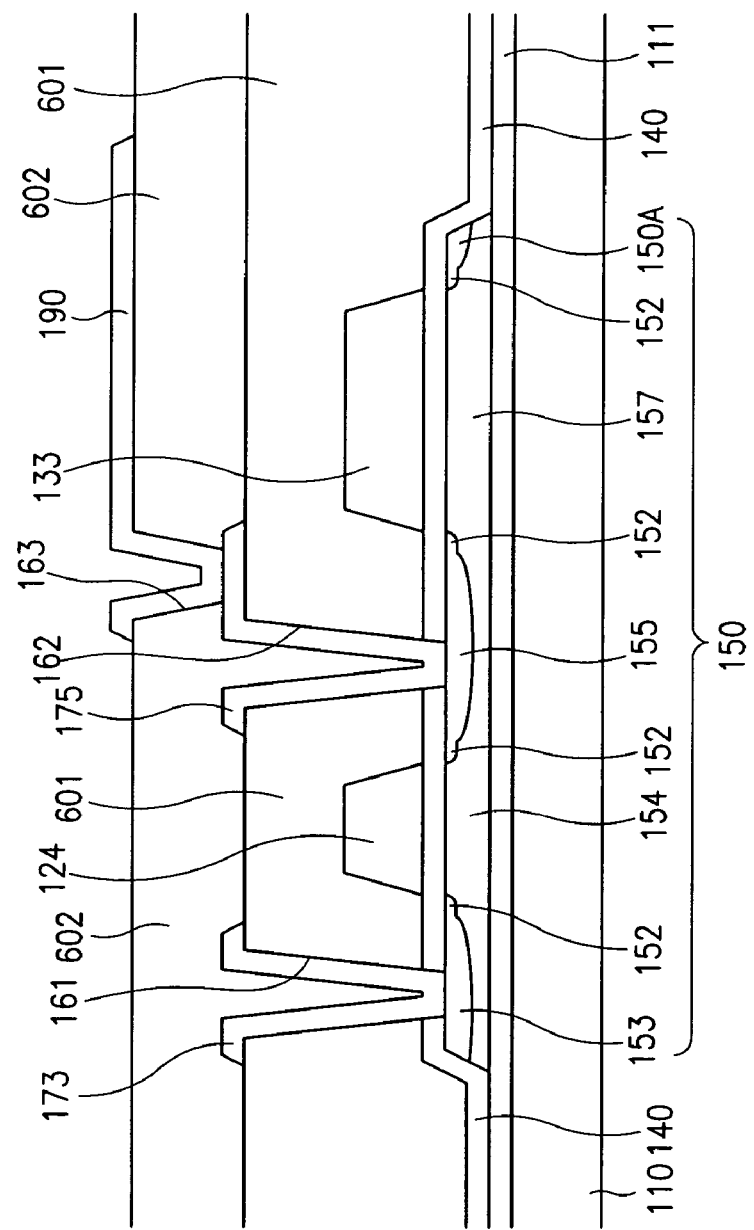
FIG. 2 is a cross-sectional view taken along the line II-II' of FIG. 1.

Referring to FIG. 1 and FIG. 2, a blocking layer 111 made of silicon oxide, etc. is formed on a transparent insulating substrate 110. A semiconductor layer 150 is formed on the blocking layer 111 and includes a source region 153 and a drain region 155 which are doped with impurities, and a channel region 154 which is made of intrinsic semiconductor and is interposed between the source region 153 and the drain region 155. The semiconductor layer 150 further comprises lightly doped drain (LDD) regions 152 formed between the source region 153 and the channel region 154, and between the drain region 155 and the channel region 154.

The LDD regions 152 prevent leakage current and a "punch through" phenomenon. The source region 153 and the drain region 155 are doped with conductive impurities of high concentration, whereas the LDD regions 152 are doped with conductive impurities of low concentration.

The conductive impurities are either P-type or N-type. Boron (B) or gallium (Ga) may be used as the P-type and phosphorus (P) or arsenic (As) can be used as the N-type.

A gate insulating layer 140 made of silicon nitride (SiNx) or silicon oxide ($SiO_2$) is formed on the semiconductor layer 150. A gate line 121 extending in a transverse direction is formed on the gate insulating layer 140. A portion of the gate line 121 extends to the semiconductor layer 150 and overlaps the channel region 154 to form a gate electrode 124. The LDD regions 152 can be overlapped with the gate electrode 124.

Also, a storage electrode line 131 is formed in parallel with the gate line 121. The storage electrode line 131 and the gate line 121 are made of the same material on the same layer. A portion of the storage electrode line 131 overlaps the semiconductor layer 150 to form a storage electrode 133. The potion of the semiconductor layer 150 overlapped with the storage electrode 133 becomes a storage electrode region 157. An end of the gate line 121 can be formed wider than the rest of the gate line 121 to connect with the exterior circuitry (not shown).

A first interlayer insulating layer 601 is formed on the gate insulating layer 140, the gate line 121, and the storage electrode line 131. The first interlayer insulating layer 601 includes a first contact hole 161 and a second contact hole 162 through which the source region 153 and the drain region 155 are exposed, respectively.

A data line 171 is formed on the first interlayer insulating layer 601. When a pair of the data lines 171 in parallel and a pair of the gate lines 121 in parallel are intersected, a pixel region is defined therein. The portion of the data line 171 is connected with the source region 153 through the first contact hole 161 to form a source electrode 173 of TFT. An end of the data line 171 may be formed wider than the rest of the data line 171 to connect with the exterior circuitry.

A drain electrode 175 is formed on the same layer as the data line 171, having a predetermined distance from the source electrode 173. The drain electrode 175 is connected with the drain region 155 through the second contact hole 162.

A second interlayer insulating layer 602 is formed on the first interlayer insulating layer 601, the drain electrode 175, and the data line 171. The second interlayer insulating layer 602 includes a third contact hole 163 through which the drain electrode 175 is exposed.

A pixel electrode 190 is formed on the second interlayer insulating layer 602 and is connected with the drain electrode 175 through the third contact hole 163.

Hereinafter, a method of manufacturing the above-mentioned TFT array panel will be described with reference to FIG. 3A through 9A, along with the above-referenced FIG. 1 and FIG. 2.

Figure 3A:
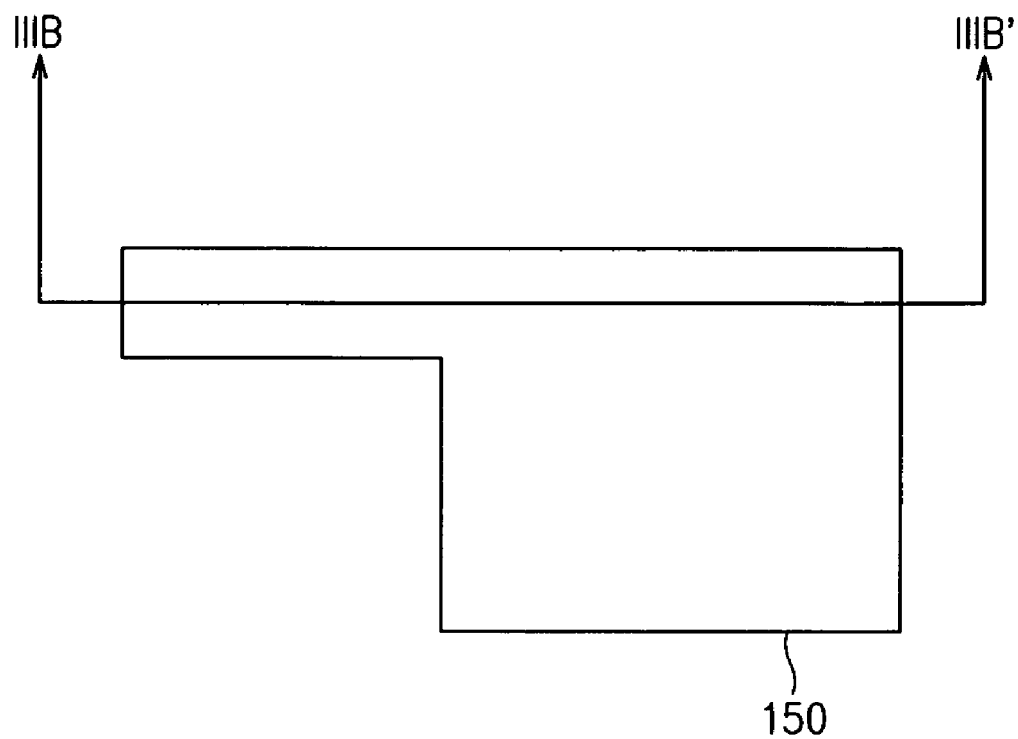
FIG. 3A, FIG. 6A, FIG. 8A, and FIG. 9A are plan views showing intermediate steps to manufacture a TFT array panel according to an embodiment of the present invention.
Figure 3B:
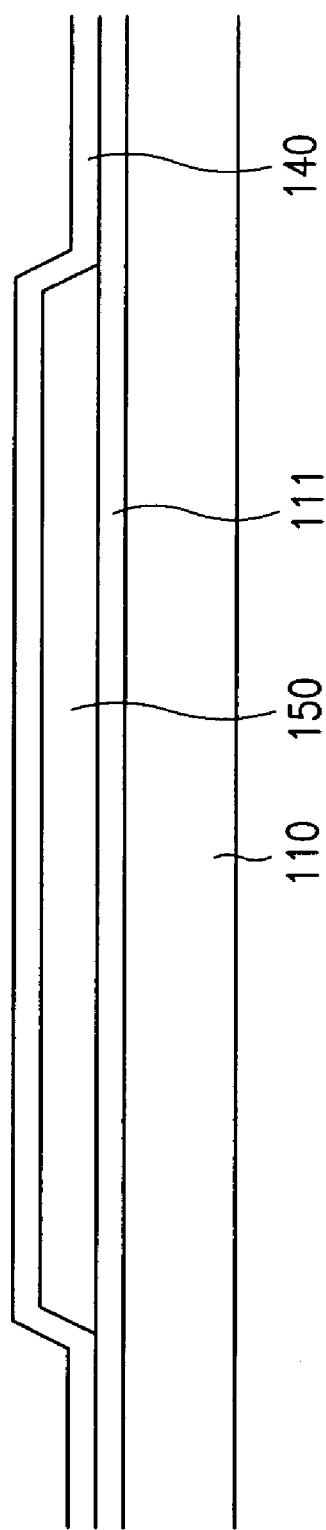
FIG. 3B is a cross-sectional view taken along the line IIIB-IIIB' of FIG. 3A.

As shown in FIG. 3A and FIG. 3B, a blocking layer 111 is formed on a transparent insulating substrate 110. The transparent insulating substrate 110 can be made of glass, quartz, sapphire, etc. The blocking layer 111 is formed by depositing silicon oxide (SiO₂) or silicon nitride (SiNx) with about 1000Å thick. Then, clean the surface to remove impurities such as natural oxide layer from the blocking layer 111.

An intrinsic amorphous silicon layer is formed with the range of 400Å to 1200Å thick by a chemical vapor deposition (CVD), etc.

Next, the amorphous silicon layer is crystallized by the sequential lateral solidification (SLS) process to form a poly crystalline silicon layer. The poly crystalline silicon layer is patterned by a photolithography using an optic mask to form a semiconductor layer 150.

The details of the crystallization process are described with reference to FIG. 4 and FIG. 5.

Figure 4:
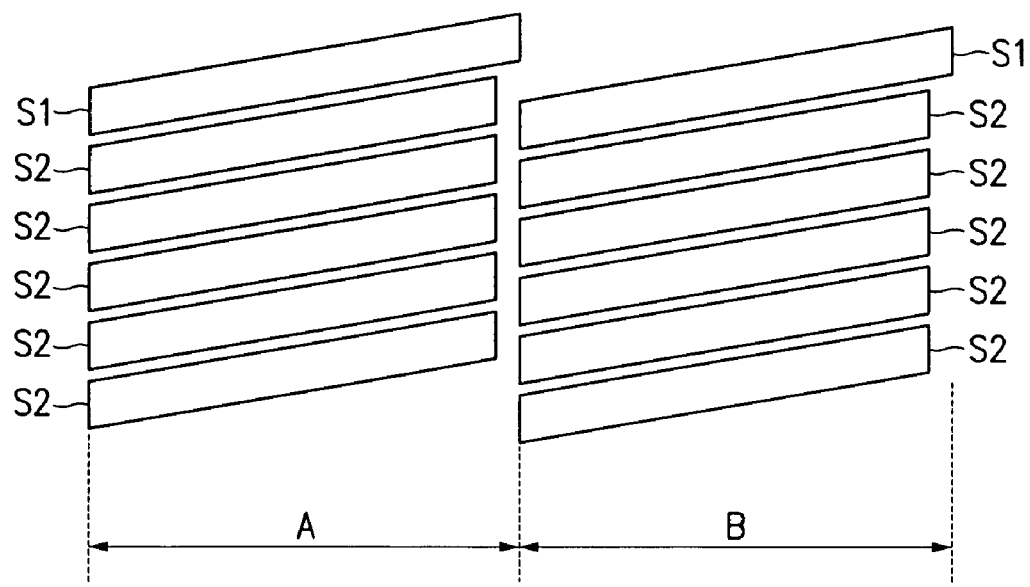
FIG. 4 and FIG. 5 are views showing crystallization processes using an optic mask pattern according to the present invention.
Figure 5:
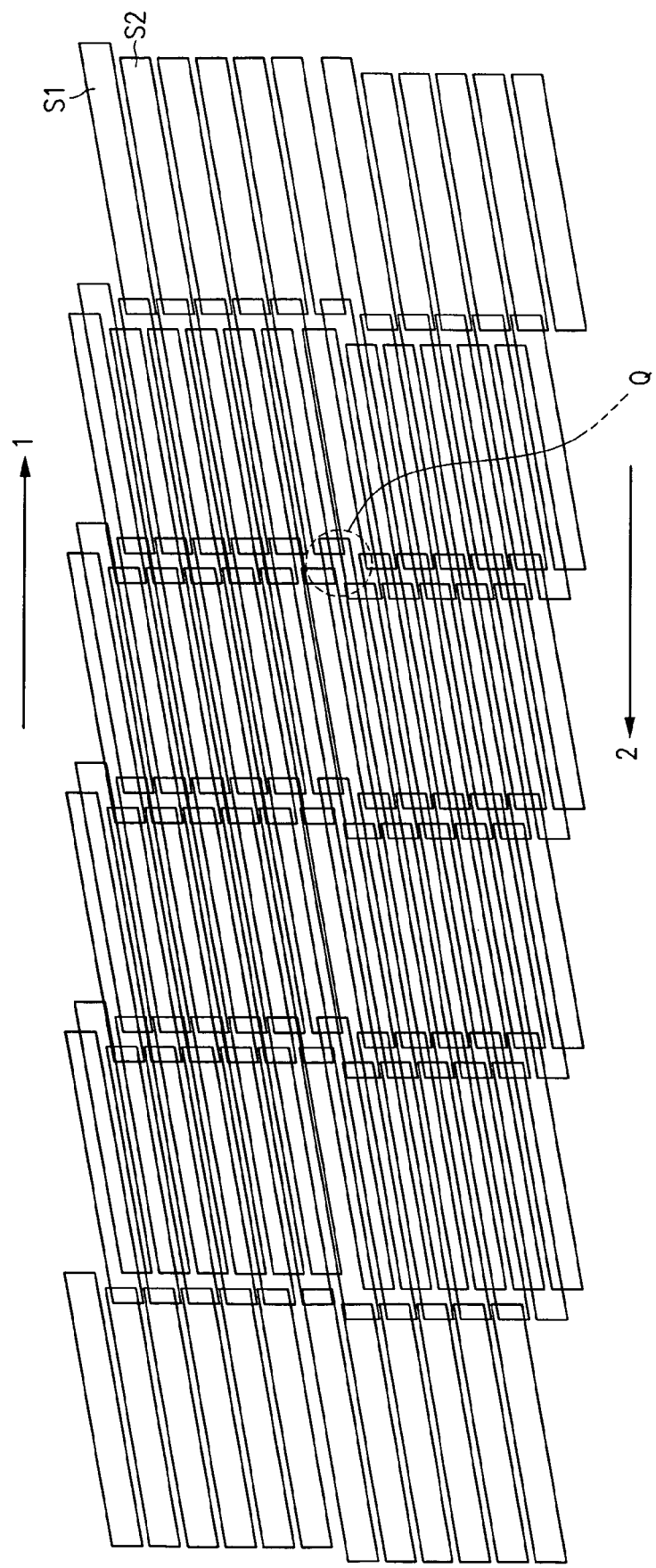

FIG. 4 is a plan view showing arrangement of slits in an optic mask according to an embodiment of the present invention and FIG. 5 is a plan view showing the transfer state of optic masks according to an embodiment of the present invention.

To poly-crystallize the amorphous silicon, an optic mask having a regular pattern, as shown in FIG. 4, is arranged on the amorphous silicon layer. The optic mask of FIG. 4 includes two regions A and B having the same pattern. Each region includes a plurality of slits which are arranged in a row and have a regular distance therebetween. The slits are passages of laser beams. Here, the slits of the regions A and B are arranged to deviate from each other and to slope by a predetermined angle to the transfer direction of the optic mask in the crystallization process.

In the poly crystalline silicon TFT, the characteristics of the TFT depends on the grain size and the boundary position of the grains of the silicon. Because the grain length of the silicon grain is similar to or a little less than the channel distance of the TFT, when the silicon boundary is parallel to the channel direction, some TFT may include one silicon grain boundary in the channel, some TFT may include two silicon grain boundary in the channel, and some TFT may include no silicon grain boundary in the channel. In this case, the TFT characteristics may not be uniform through the whole display area. If the boundary of the silicon grain is inclined at a certain angle to the TFT channel, the characteristics of the TFT will be much more uniform through the whole display area.

To make the silicon grain boundary to be inclined from the TFT channel, the TFT channel can be inclined from the display when the grain boundary is parallel to the display. Another solution is crystallizing the silicon to an inclined direction from the display when the TFT channel is parallel to the display. To do this, inclining the substrate from the photo mask transferring direction is one way, inclining the photo mask pattern from the mask transferring direction is another way.

It is preferable that the uppermost slit S1 which is provided at the uppermost portion of each region A and B is longer than the other slits S2 which are provided in the rest portion of each region A and B. The uppermost slit S1 may be provided more than one in each region A and B. It is also preferable that the more inclined the slit from the transfer direction of the mask, the more of the uppermost slit S1.

Through the slits S1 and S2 arranged in the optic mask, a laser beam is irradiated to the amorphous silicon layer, so that laser-irradiated amorphous silicon changes into liquid state while non-irradiated amorphous silicon remains in solid state. Accordingly, the crystallization begins from the border of the solid and liquid, and grains are vertically grown to the border of the solid and liquid.

Next, as shown in FIG. 5, a laser beam is irradiated to crystallize the amorphous silicon layer while the optic mask is horizontally transferred. The grains grow until the grains meet each other. After completing a horizontal translation and laser irradiation, the optic mask is vertically translated and another horizontal translation and laser irradiation in the opposite direction is successively performed to crystallize the amorphous silicon layer. That is, the optic mask is transferred in zigzag fashions to crystallize the amorphous silicon layer. Transfer of the optic mask and laser irradiation are performed through the entire amorphous silicon layer.

When one silt S1 disposed at the uppermost portion is longer than the other slits S2, the amorphous silicon positioned at the border portions Q of shots can be completely crystallized even when misalignment is occurred in the transferring optic mask.

Here, it is preferable that the uppermost slit S1 is longer than the other slits S2 by the margin of misalignment of the mask. In this embodiment, the uppermost slit S1 is longer than the other slits S2 by 3 um to 4 um. Also preferably, the number of the uppermost slit S1 can be plural depending on the slope angle of the slits S1 and S2.

Figure 6A:
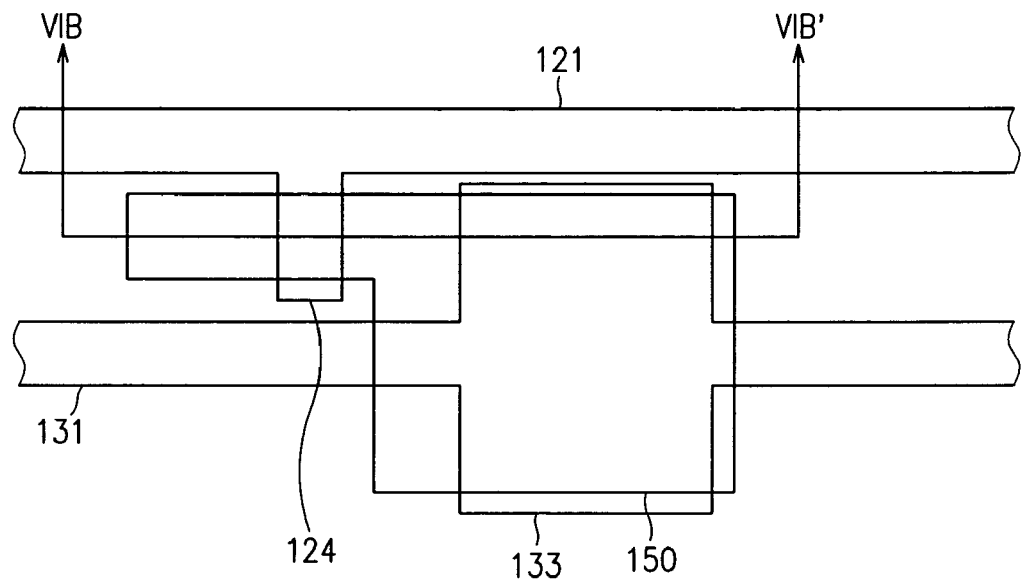
Figure 6A:
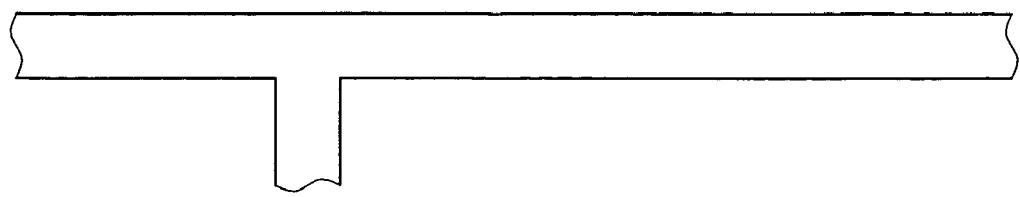
Figure 6B:
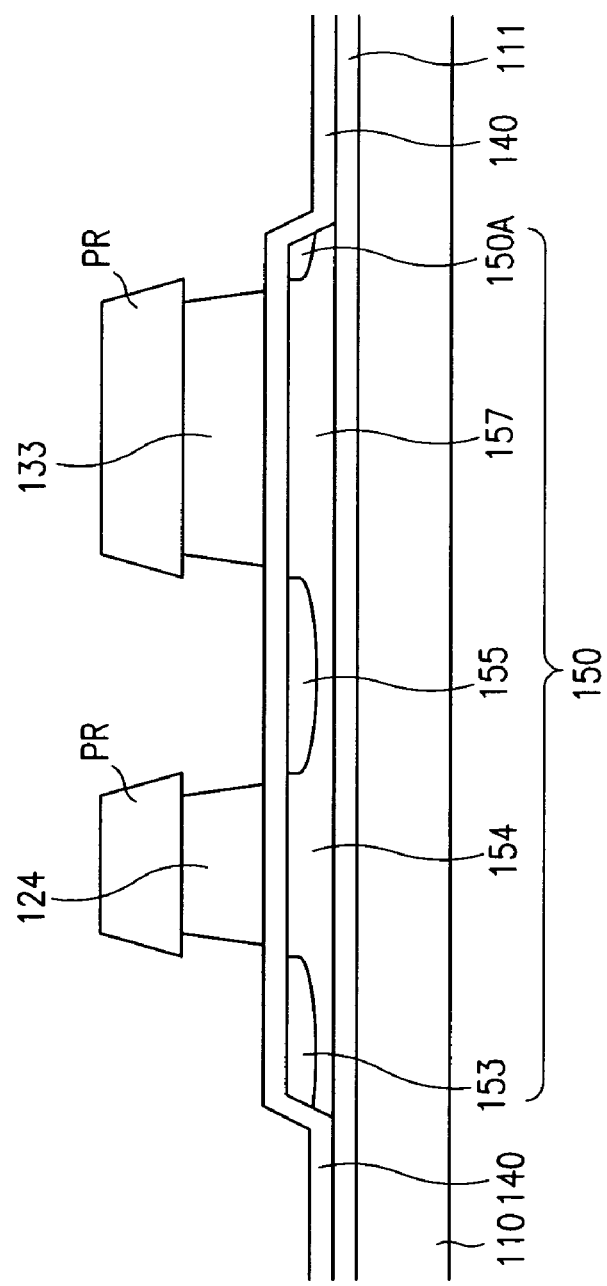
FIG. 6B is a cross-sectional view taken along the line VIB-VIB' of FIG. 6A.

As shown in FIGS. 6A and 6B, insulating material such as SiNx, SiO₂, etc. is deposited on the semiconductor layer 150 by CVD process to form a gate insulating layer 140. Subsequently, a metal layer is deposited on the gate insulating layer 140 as a single layer or multi layers. The metal layer is made of at least one of silver (Ag), copper (Cu), titanium (Ti), aluminum (Al), tungsten (W), molybdenum (Mo), and alloy thereof.

After forming the metal layer, a photoresist layer is deposited on the metal layer, and etched using a photo mask to form a photoresist pattern. The metal layer is etched by wet etching or dry etching to form a gate line 121 and a storage electrode line 131. At this time, the metal layer is over-etched in order that the gate line 121 and the storage electrode 131 have narrower widths than that of the photoresist pattern.

The gate line 121 and the storage electrode 131 have tapered lateral sides, so that the gate line 121 and the storage line 131 can be adhered more tightly with the overlying layer. In addition, it is possible to omit the storage electrode 131 if storage capacitance is sufficient without the storage electrode 131.

Then, the semiconductor layer 150 is heavily doped with conductive impurities using a mask of the photoresist pattern to form a source region 153 and a drain region 155.

Figure 7:
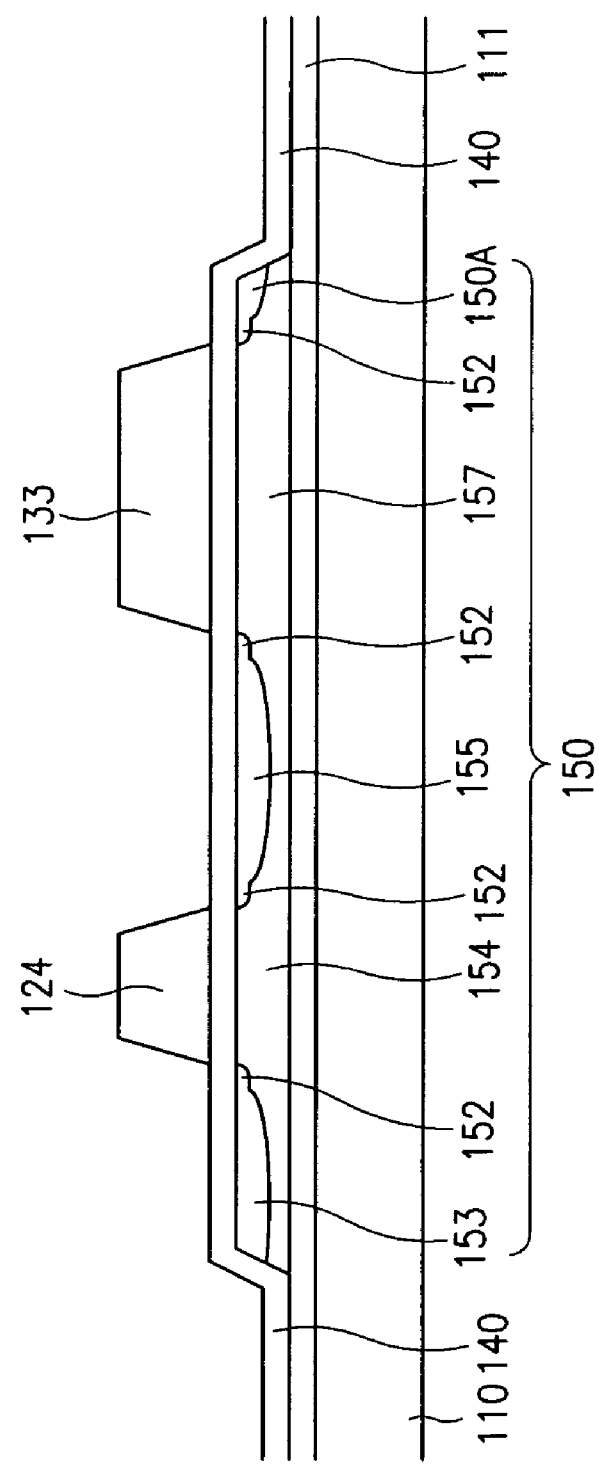
FIG. 7 is a cross-sectional view showing a subsequent step of FIG. 6B.

Subsequently, as shown in FIG. 7, the semiconductor layer 150 is lightly doped with conductive impurities using a mask of the gate line 121 and the storage electrode 131 after the photoresist pattern is removed, thereby completing the semiconductor layer 150 having LDD regions 152. Here, if the gate line 121 is not made of a material having high thermostability and high chemical property, such as titanium (Ti), the impurities can be doped after forming another photoresist pattern to reduce damage of interconnections.

In the above, the LDD regions 152 are formed by using the photoresist pattern, but it can be formed without photoresist pattern if the metal layers having different etching ratios are provided or a pair of spacers is formed to each sidewall of the gate line 121.

Additionally, since the semiconductor layer 150, the storage electrode line 131, and the storage electrode 133 are different in width and length, portions of the semiconductor layer 150 are not covered with the storage electrode line 131 and the storage electrode 133. The uncovered portions 150A also have the impurities and are adjacent to the storage electrode region 157. The uncovered portions 150A are separated from the drain region 155.

Figure 8A:
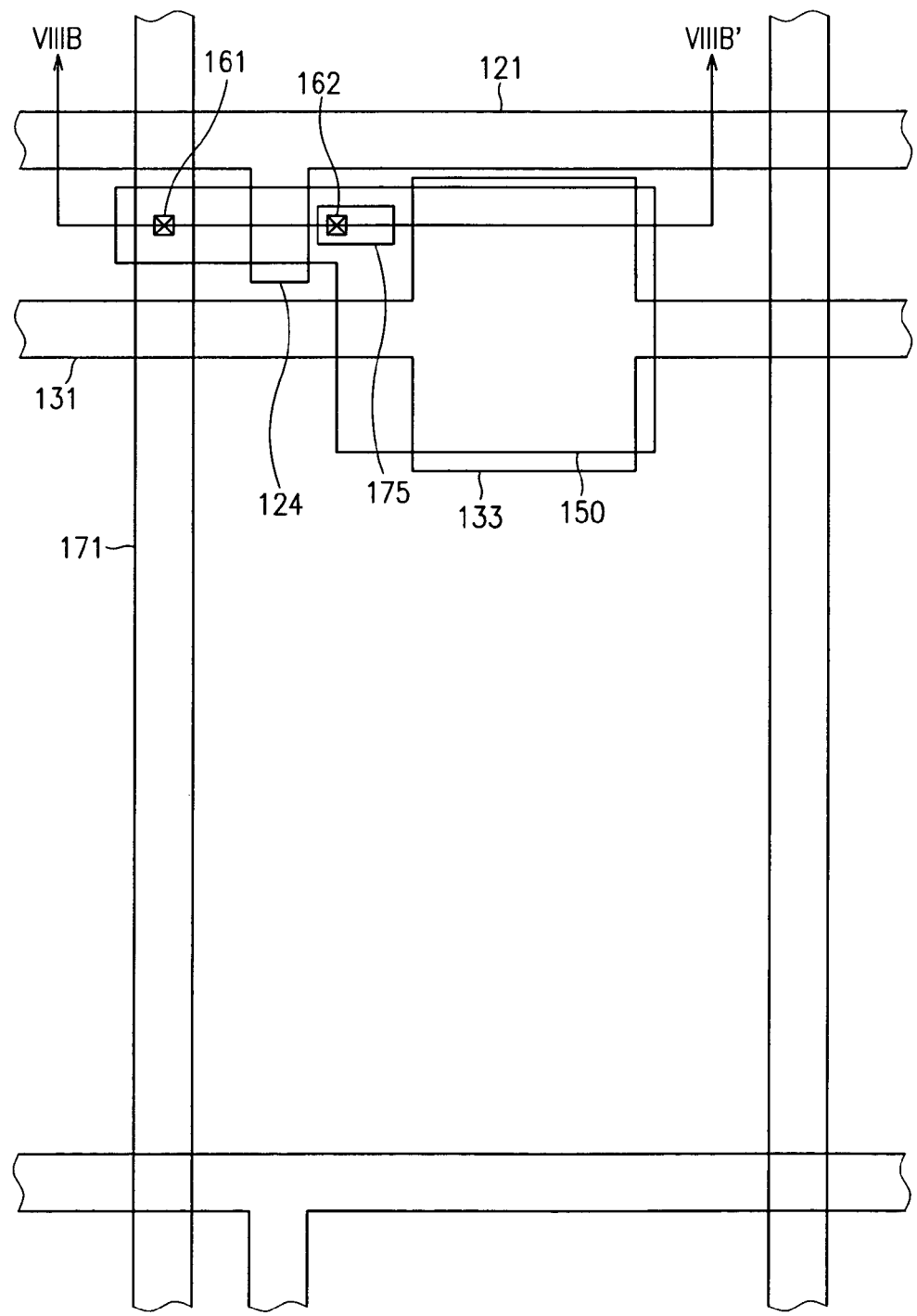

Next, as shown in FIG. 8A and FIG. 8B, a first interlayer insulating layer 601 is formed on the entire substrate 110, and then etched to form a first contact hole 161 and a second contact hole 162 where the source region 153 and the drain region 155 are respectively exposed.

The first interlayer insulating layer 601 can be made of an organic material having prominent planarization property and photosensitivity, an insulating material having low dielectric constant such as a-Si:C:O and a-Si:O:F, which are formed by plasma enhanced chemical vapor deposition (PECVD), or an inorganic material such as SiNx, etc.

Next, a metal layer made of tungsten (W), titanium (Ti), aluminum (Al), or alloy thereof is deposited on the first interlayer insulating layer 601 as a single layer or multi layers. The metal layer is then patterned by photo etching process to form a data line 171 including a source electrode 173 which is connected with the source region 153 through the contact hole 161, and to form a drain electrode 175 which is connected with the drain region 155 through the contact hole 162.

The data line 171 and the drain electrode 175 have tapered lateral sides, so that the data line 171 and the drain electrode 175 can be adhered more tightly with the overlying layer.

Figure 9A:
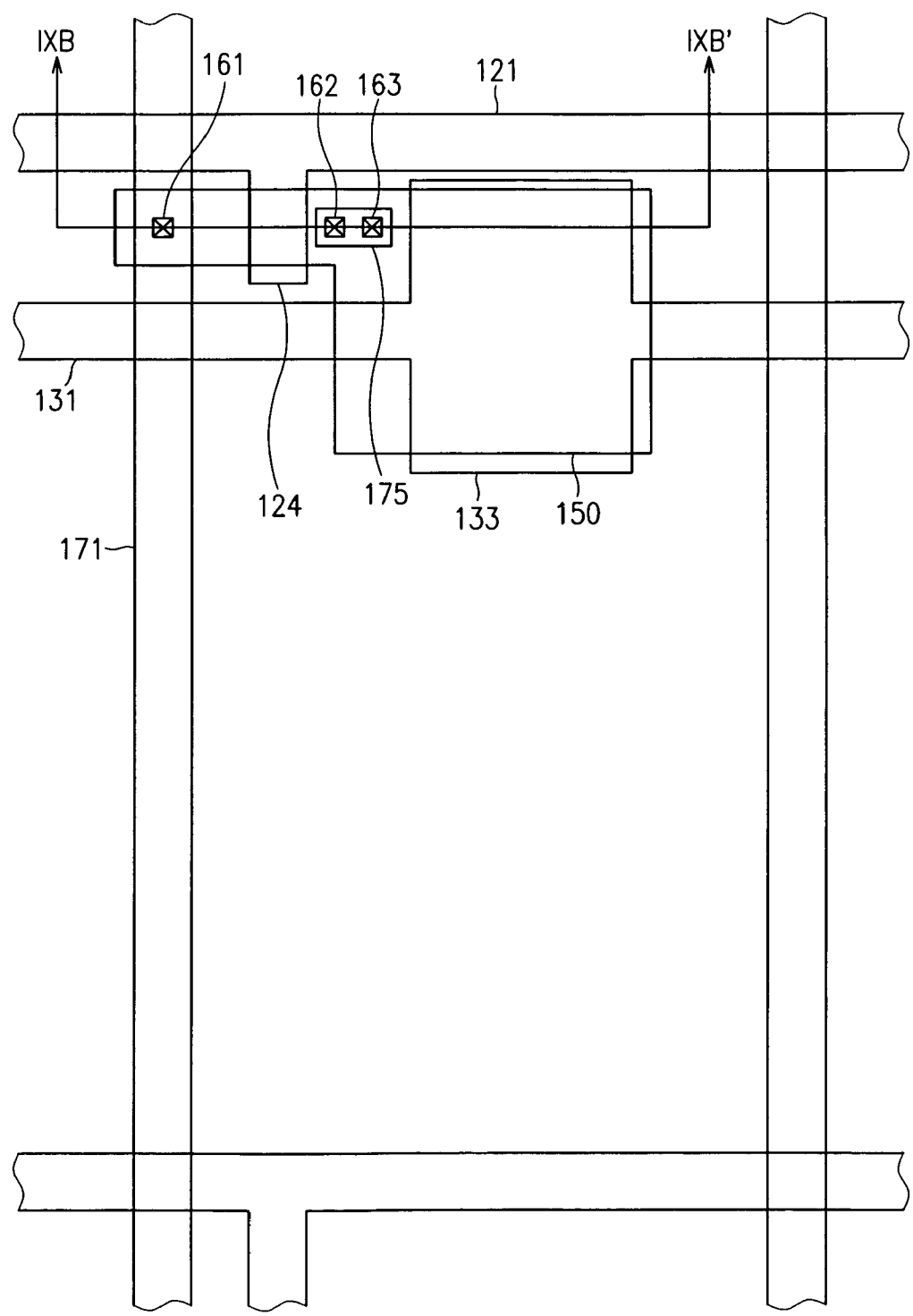
Figure 9B:
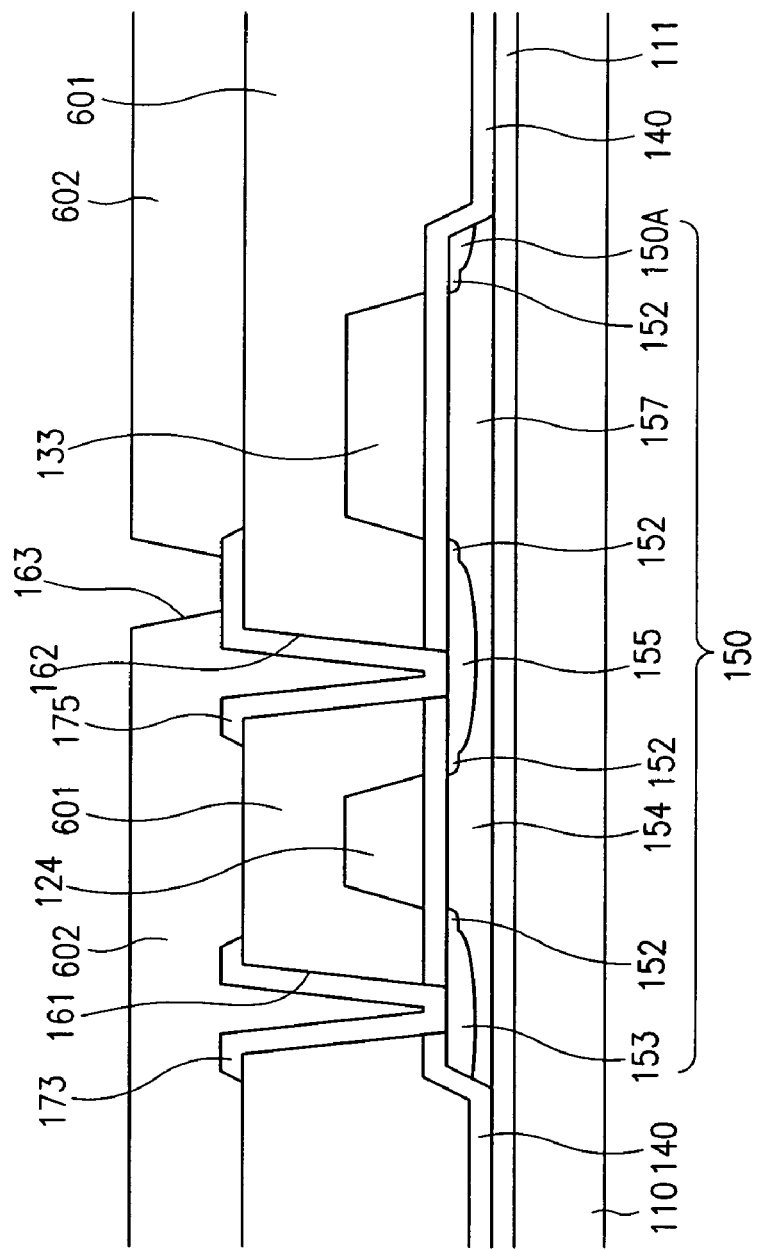
FIG. 9B is a cross-sectional view taken along the line IXB-IXB' of FIG. 9A.

As shown in FIG. 9A and FIG. 9B, a second interlayer insulating layer 602 is formed to cover the data line 171 and the drain electrode 175. Then, the second interlayer insulating layer 602 is patterned by photo etching process to form a third contact hole 163 through which the drain electrode 175 is exposed. The second interlayer insulating layer 602 can be made of the same material as the first interlayer insulating layer 601.

Next, as shown in FIG. 1 and FIG. 2, a transparent conductive material such is as indium zinc oxide (IZO), indium tin oxide (ITO), etc., is deposited on the second interlayer insulating layer 602. The transparent conductive layer is then patterned to form a pixel electrode 190 which is connected with the drain electrode 175 through the third contact hole 163.

In case that the second interlayer insulating layer 602 is made of insulating materials of low dielectric constant, the pixel electrode 190 may overlap the data line 171 and the gate line 121, so that the aperture ratio of the pixel electrode 190 is enhanced.

Embodiment 2

Figure 10:
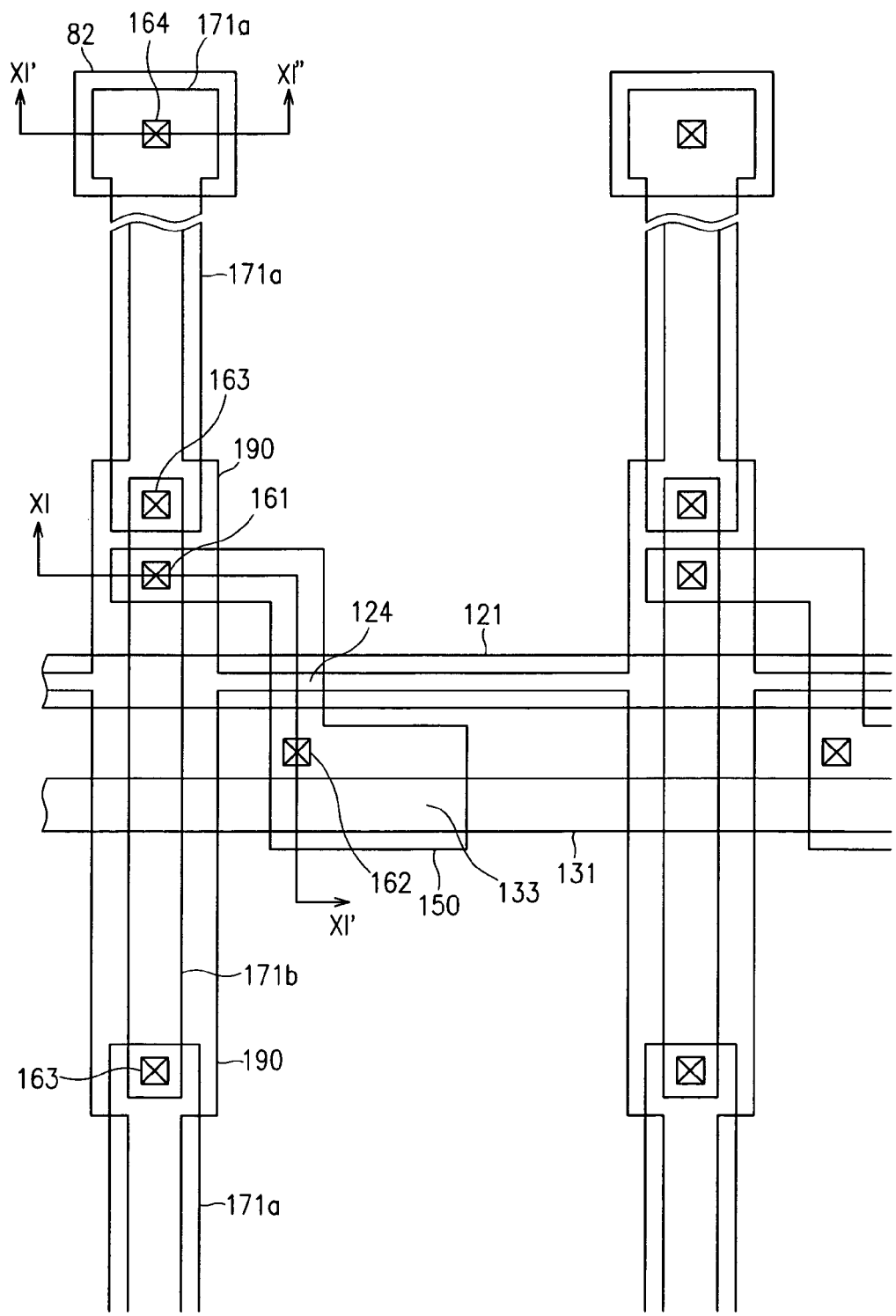
FIG. 10 is a plan view of a TFT array panel according to another embodiment of the present invention.
Figure 11:
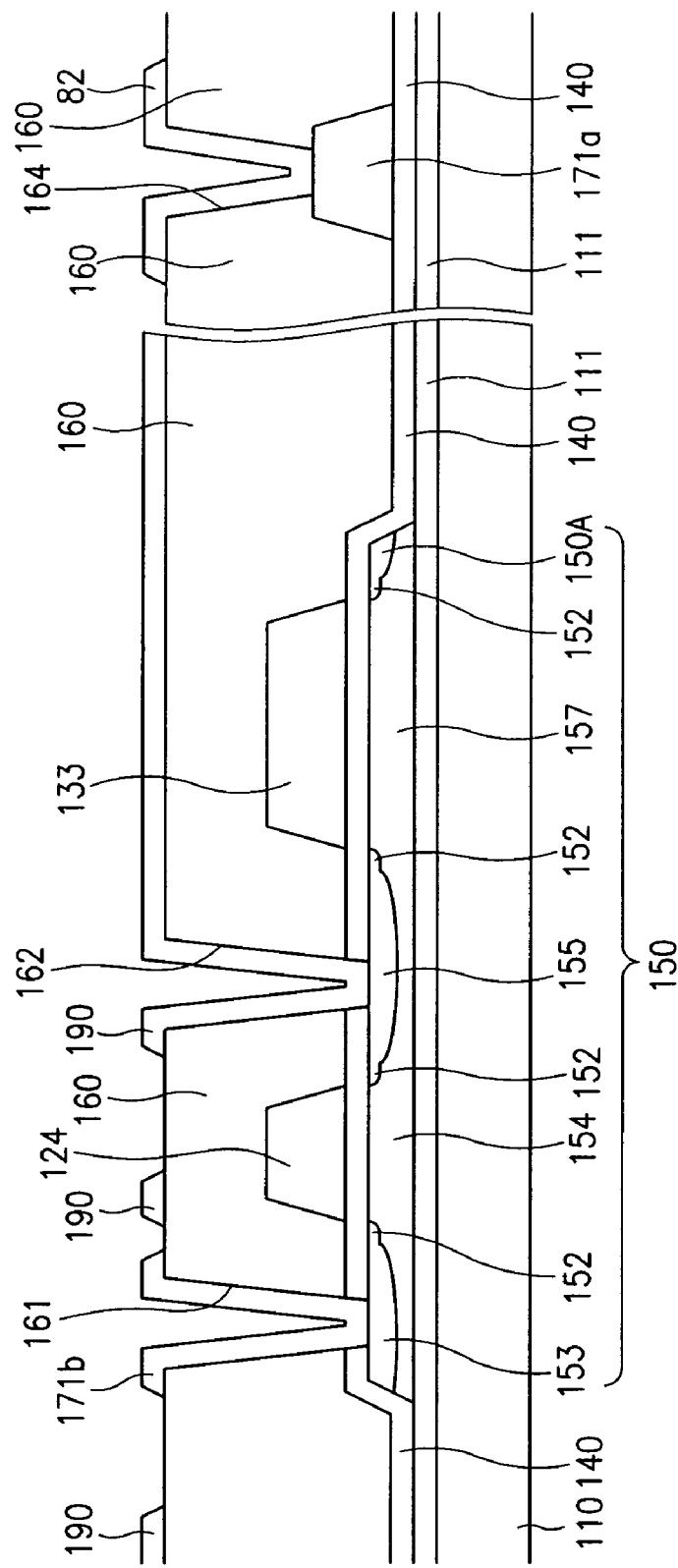
FIG. 11 is a cross-sectional view taken along the line XI-XI'-XI" of FIG. 10.

As shown in FIGS. 10 and 11, a data connection part 171b and a pixel electrode 190 may be made of the same material on the same layer, and contact holes 161 and 162 for connecting the data connection part 171b with a source region 153 and a drain region 155 of a semiconductor layer 150 are simultaneously formed, respectively. According to this embodiment, it is possible to reduce the number of photo masks compared to the first embodiment.

Details are described hereinafter. Some process and structure is same to the first embodiment. Therefore those descriptions are left out this time. A data metal piece 171a is formed on the same layer as the gate line 121 and extends perpendicular to the gate line 121, being separated from the gate line 121 by a predetermined distance. The data metal piece 171a is disposed between two adjacent gate lines 121, but it is not connected with them. Also, an end of the outermost data metal piece 171a can be enlarged to receive image signals from the external circuit (not shown).

An interlayer insulating layer 160 is formed on the gate insulating layer 140, the gate line 121, and the storage electrode line 131.

On the interlayer insulating layer 160, a data connection part 171b, a pixel electrode 190, and a contact assistant 82 are formed. The data connection part 171b is vertically formed to intersect the gate line 121 and the storage electrode line 131.

The data metal piece 171a is connected with the data connection part 171b through a third contact hole 163 formed in the interlayer insulating layer 160, and the data connection part 171b is connected with the source region 153 through the first contact hole 161. That is, the plurality of data metal pieces 171a which are separated from each other are connected to each other by the data connection parts 171b which pass over the gate line 121 and the storage electrode line 131.

The pixel electrode 190 is connected with the drain electrode 155 through a second contact hole 162 which is formed in the interlayer insulating layer 160 and the gate insulating layer 140. The contact assistant 82 is connected with the gate line 121 (not shown) and an end of the data metal piece 171a through a fourth contact hole 164 which is formed in the interlayer insulating layer 160.

The contact assistant 82 is to supplement adhesion between the end portion of the data line 171a and the external devices and to protect them. Accordingly, it is optional to apply the contact assistant 82 or to omit it since it is not essential.

Hereinafter, a method of manufacturing the above-mentioned TFT array panel will be described with reference to FIG. 12A through 15B, along with the above-referenced FIG. 10 and FIG. 11.

Figure 12A:
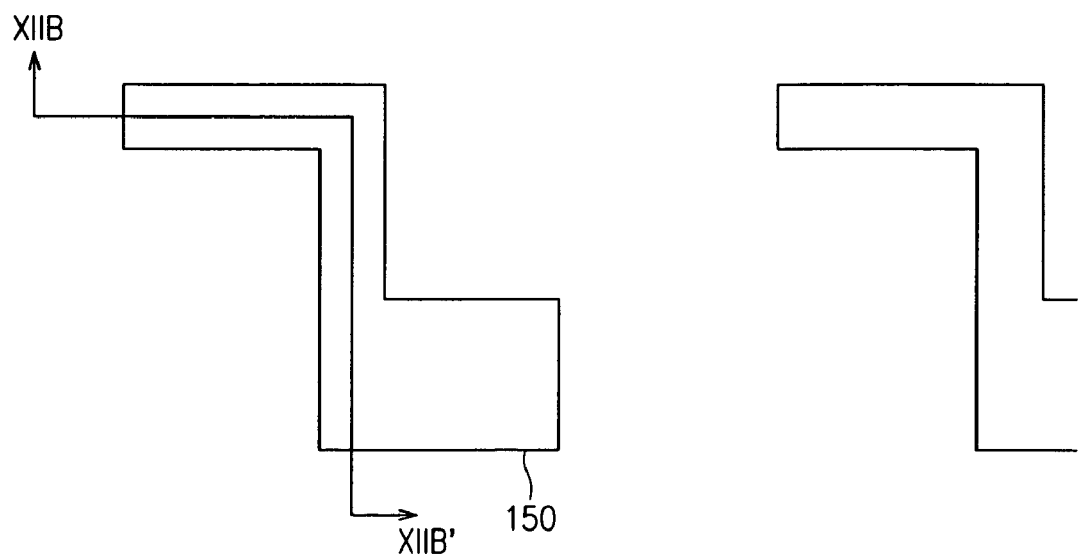
FIG. 12A, FIG. 13A, and FIG. 15A are plan views showing intermediate steps to manufacture a TFT array panel according to another embodiment of the present invention.
Figure 12B:
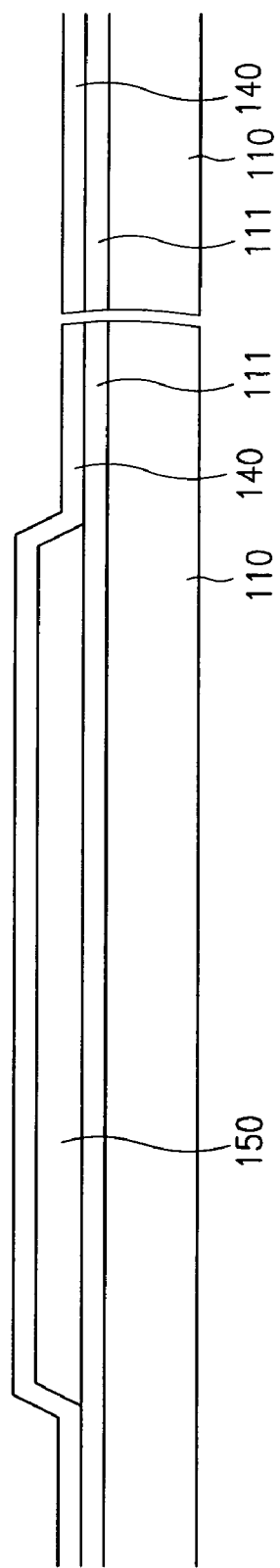
FIG. 12B is a cross-sectional view taken along the line XIIB-XIIB'-XIIB" of FIG. 12A.

As shown in FIGS. 12A and FIG. 12B, a blocking layer 111 is first formed on a transparent insulating substrate 110. The transparent insulating substrate 110 can be made of glass, quartz, sapphire, etc. The blocking layer 111 is formed by depositing silicon oxide ($SiO_2$) or silicon nitride (SiNx) to a thickness of approximately 1000Å. Then, it is cleaned to remove impurities such as natural oxide layer from the blocking layer 111.

An intrinsic amorphous silicon layer is formed to a thickness within the range of 400Å to 1200Å by a chemical vapor deposition (CVD) or other method.

Next, sequential lateral solidification (SLS) process is performed to crystallize the amorphous silicon layer. The crystallization method is equal to the method of the first embodiment illustrated in FIG. 4 and FIG. 5.

Figure 13A:
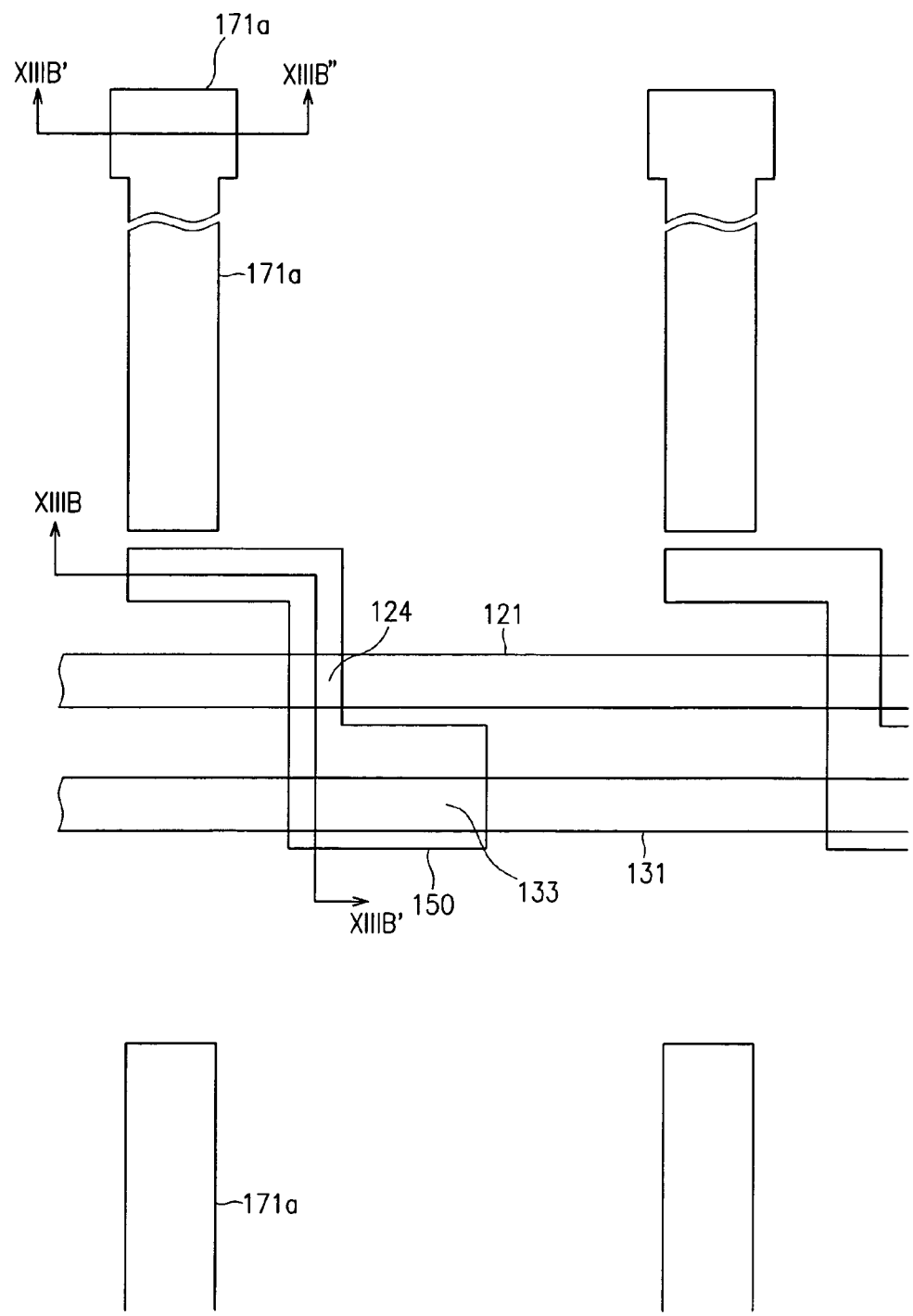
Figure 13B:
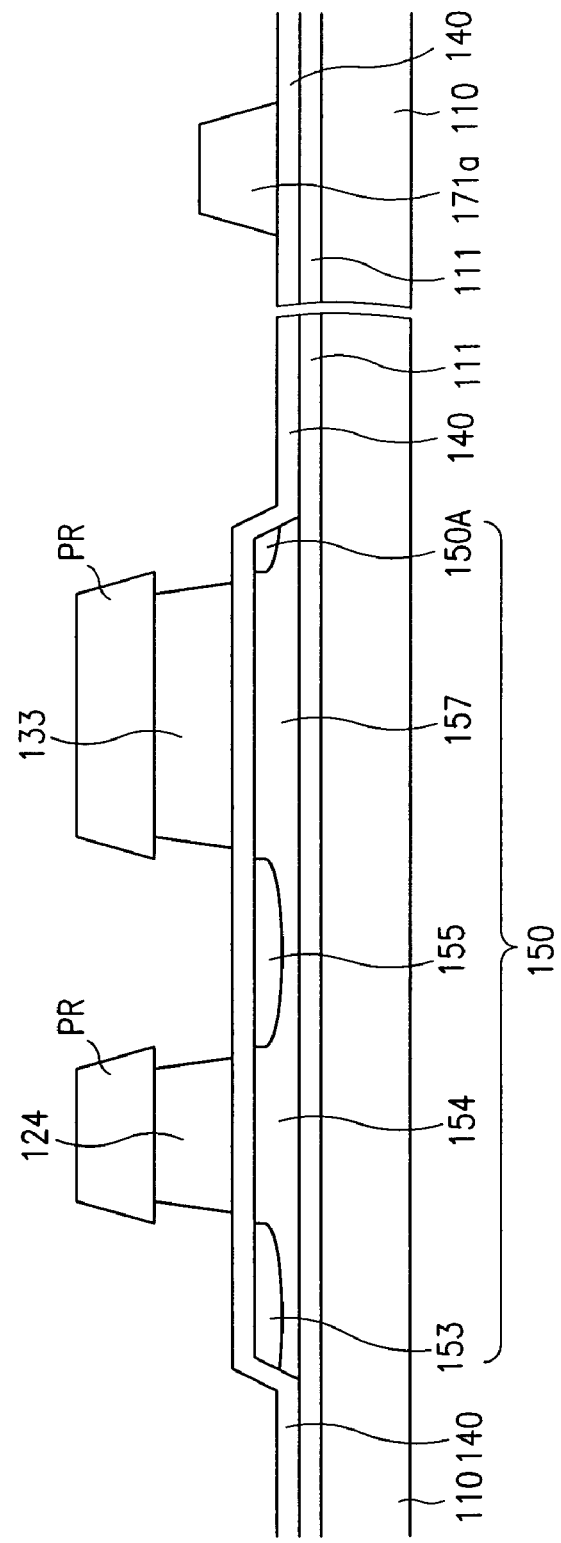
FIG. 13B is a cross-sectional view taken along the line XIIIB-XIIIB'-XIIIB" of FIG. 13A.

Next, as shown in FIG. 13A and FIG. 13B, the poly crystalline silicon layer is patterned by photo etching process using an photo mask, thereby forming a semiconductor layer 150 made of poly crystalline silicon. As a result, this semiconductor layer 150 has the same pattern as that of the first embodiment.

Insulating material such as SiNx, $SiO_2$, etc. is deposited on the semiconductor layer 150 by CVD process to form a gate insulating layer 140. Thereafter, a metal layer is deposited on the gate insulating layer 140 as a single layer or multi layers. The metal layer is made of one or more materials selected from the group of silver (Ag), copper (Cu), titanium (Ti), aluminum (Al), tungsten (W), and alloy thereof, After the formation of the metal layer, a photoresist layer is deposited on the metal layer and photo etching process is then performed using a photo mask to form a photoresist pattern. The metal layer is etched by wet etching or dry etching to form a gate line 121, a storage electrode line 131, and a data metal piece 171a. Here, the metal layer is over-etched in order that the gate line 121 and the storage electrode 131 have narrower widths than that of the photoresist pattern.

The gate line 121, the data metal piece 171a, and the storage electrode 131 have tapered lateral sides, so that the gate line 121, the data metal piece 171a, and the storage line 131 can be adhered more tightly with the overlying layer. In addition, it is possible to omit the storage electrode 131 if storage capacitance is sufficient without the storage electrode 131.

Then, the semiconductor layer 150 is heavily doped with conductive impurities using a mask of the photoresist pattern to form a source region 153 and a drain region 155.

Figure 14:
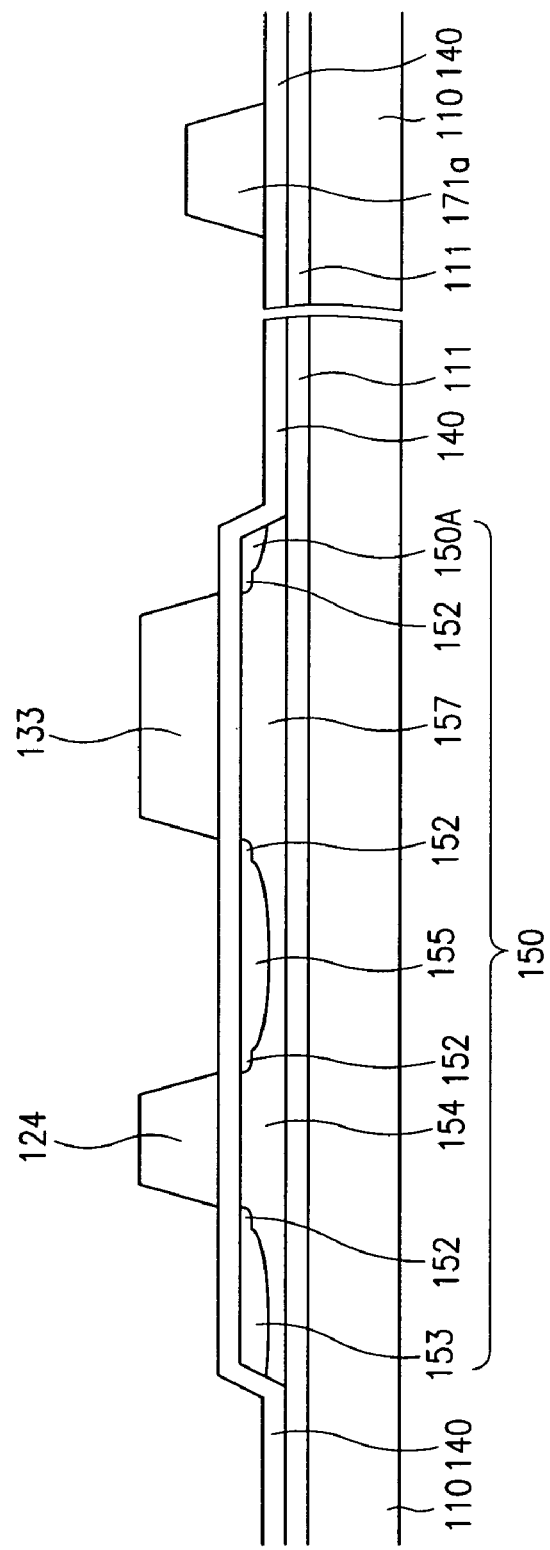
FIG. 14 is a cross-sectional view showing a subsequent step of FIG. 13B.

Subsequently, as shown in FIG. 14, the semiconductor layer 150 is lightly doped with conductive impurities using a mask of the gate line 121 and the storage electrode line 131 after the photoresist pattern is removed, thereby completing the semiconductor layer 150 having LDD regions 152. Here, if the gate line 121 is not made of a material having high thermo stability and high chemical property, such as titanium (Ti), the impurities can be doped after formation of another photoresist pattern to reduce damage of interconnections.

In the above, the LDD regions 152 are formed by using the photoresist pattern, but it can be formed by metal layers which have different etching ratio with each other are provided or a pair of spacers can be formed to each sidewall of the gate line 121 to form the LDD regions.

Additionally, since the semiconductor layer 150, the storage electrode line 131, and the storage electrode 133 are different in width and length, portions of the semiconductor layer 150 are not covered with the storage electrode line 131 and the storage electrode 133. The exposed portions 150A also have the impurities and are adjacent to the storage electrode region 157. The exposed portions 150A are separated from the drain region 155.

Figure 15A:
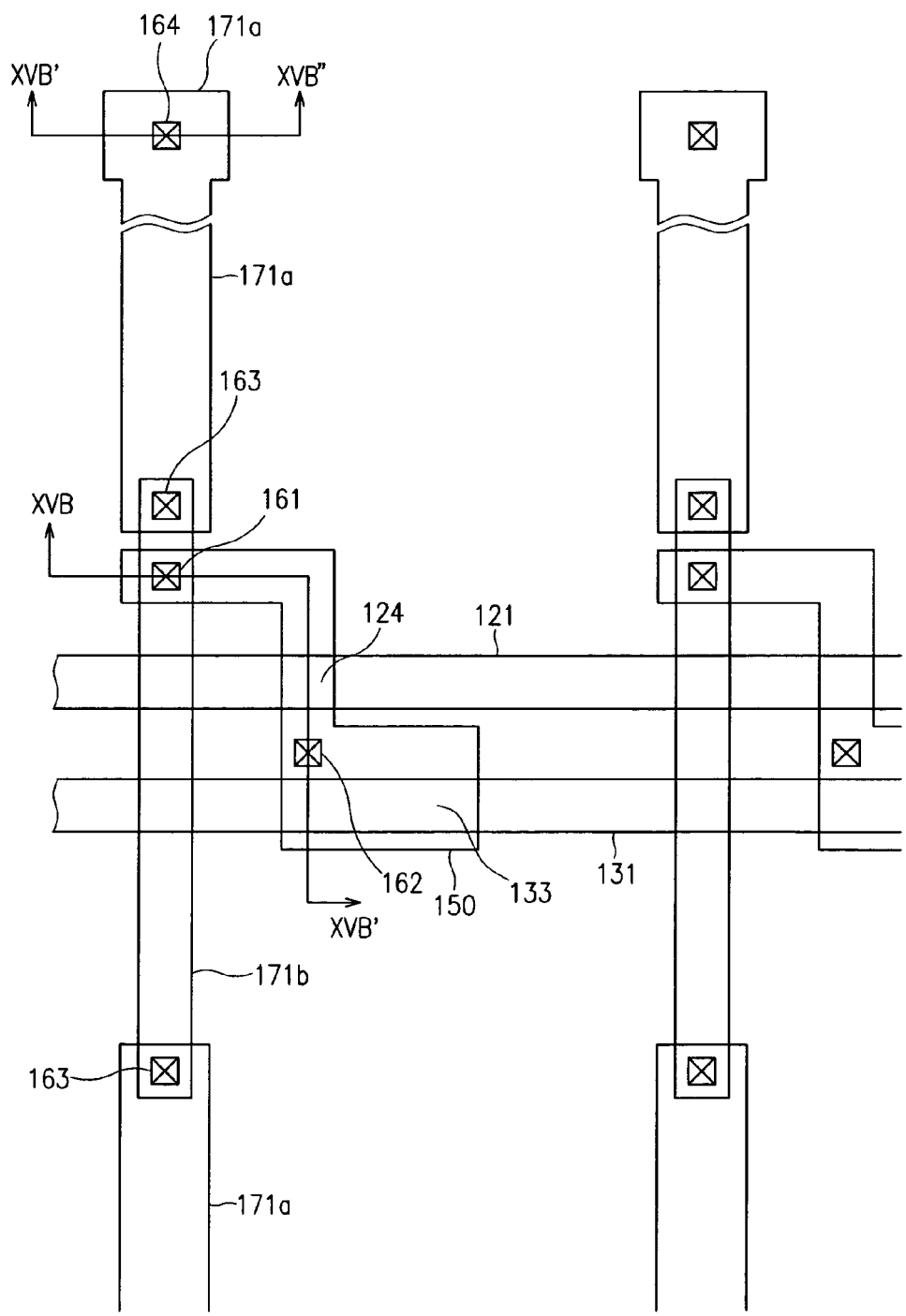
Figure 15B:
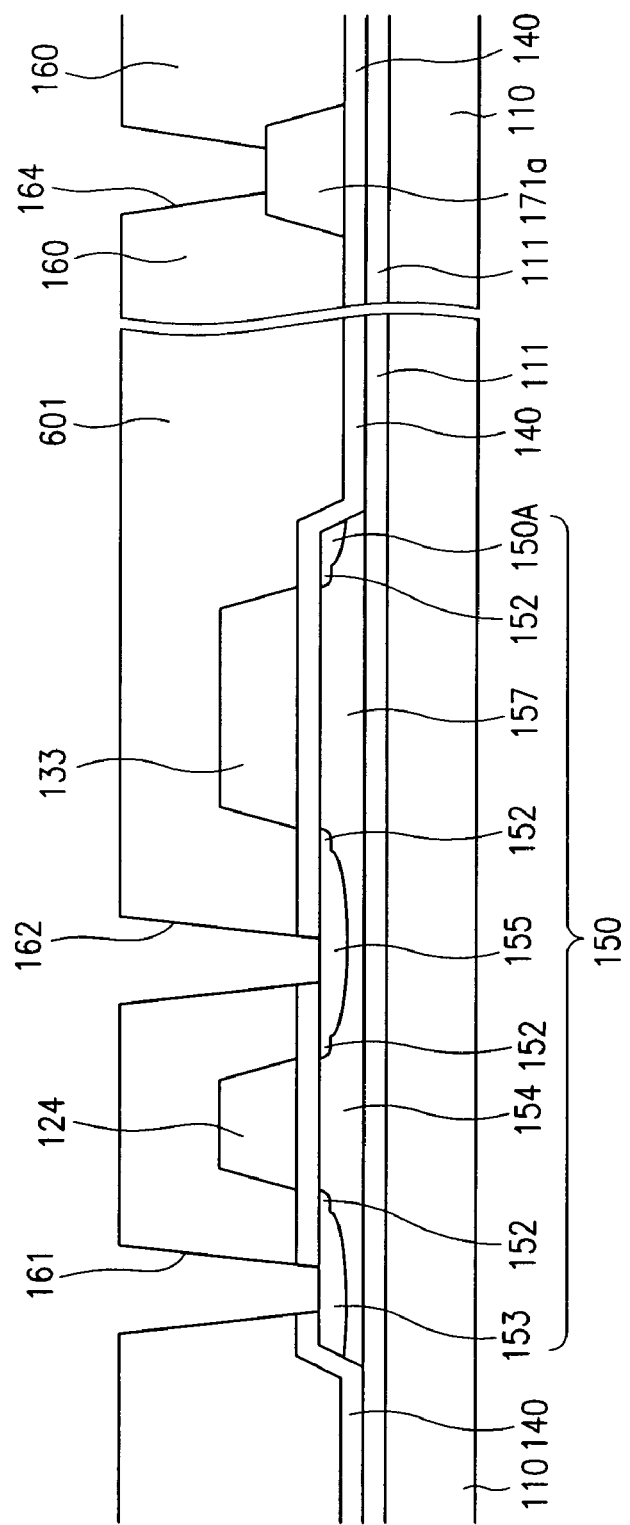
FIG. 15B is a cross-sectional view taken along the line XVB-XVB'-XVB" of FIG. 15A.

As shown in FIGS. 15A and 15B, an interlayer insulating layer 160 is deposited on the entire substrate 110 including the source region 153, the drain region 155, and the channel region 154. The interlayer insulating layer 160 can be made of an organic material having prominent planarization property and photosensitivity, an insulating material having low dielectric constant such as a-Si:C:O and a-Si:O:F, which are formed by plasma enhanced chemical vapor deposition (PECVD), or an inorganic material such as SiNx, etc.

Then, the interlayer insulating layer 160 is etched to form a first contact hole 161 where the source region 153 is exposed, a second contact hole 162 where the drain region 155 is exposed, a third contact hole 163 where the data metal piece 171a is exposed, and a fourth contact hole 164 where an end of the data metal piece 171a is exposed.

In case that the interlayer insulating layer 160 is made of organic materials having photo-sensitivity, the contact holes can be formed only by the photolithography process.

As shown in FIG. 10 and FIG. 11, transparent conductive material is deposited on the interlayer insulating layer 160 including inner surfaces of the first contact hole 161, the second contact hole 162, the third contact hole 163, and the fourth contact hole 164, thereby forming a conductive layer. The conductive layer is then patterned to form a data connection part 171b, a pixel electrode 190, and a contact assistant 82.

Here, the data metal piece 171a is connected with the data connection part 171b through the third contact hole 163, and the data connection part 171b is connected with the source region 153 through the first contact hole 161. The pixel electrode 190 is connected with the drain region 155 through the second contact hole 162, and the contact assistant 82 is connected with the data metal piece 171a through the fourth contact hole 164.

In case that the second interlayer insulating layer 160 is made of insulating materials of low dielectric constant, the pixel electrode 190 may overlap the data metal piece 171a and the gate line 121, so that the aperture ratio of the pixel electrode 190 is enhanced.

As mentioned in the above, the slits having different lengths enable amorphous silicon to be completely crystallized even when a certain amount of misalignment occurs during the transfer of the optic mask Embodiment 3

Now a mask for crystallization and a manufacturing method of a TFT array panel according to another embodiment of the present invention will be described with reference to drawings.

In the sequential lateral solidification (SLS), an amorphous silicon layer is partially melted by laser illumination through a mask having slits to form liquid regions, and then the liquid is solidified. During the solidification, crystal grains of polysilicon grow in a vertical direction to the boundary surface of the liquid and solid regions. In the present embodiment, the slits of mask that is transparent area of the laser have curved boundary line. A polysilicon layer fabricated by the present embodiment has grain group s having curved boundary line that is the same shape of the slits. This feature will be described with reference to drawings.

Figure 16:
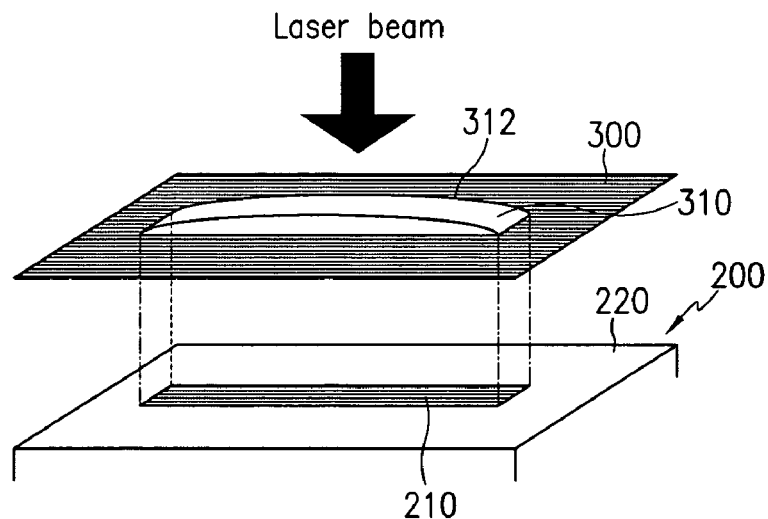
FIG. 16 is a view showing laser beam irradiation using a mask.
Figure 17:
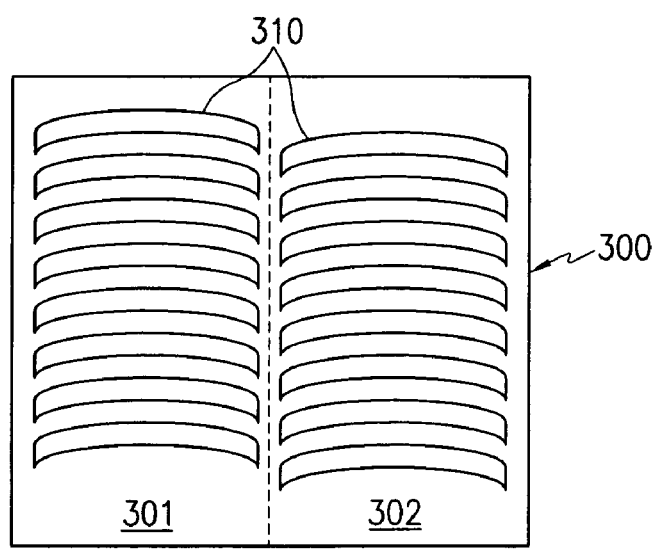
FIG. 17 plane view of a mask according to an embodiment of the present invention.
Figure 18:
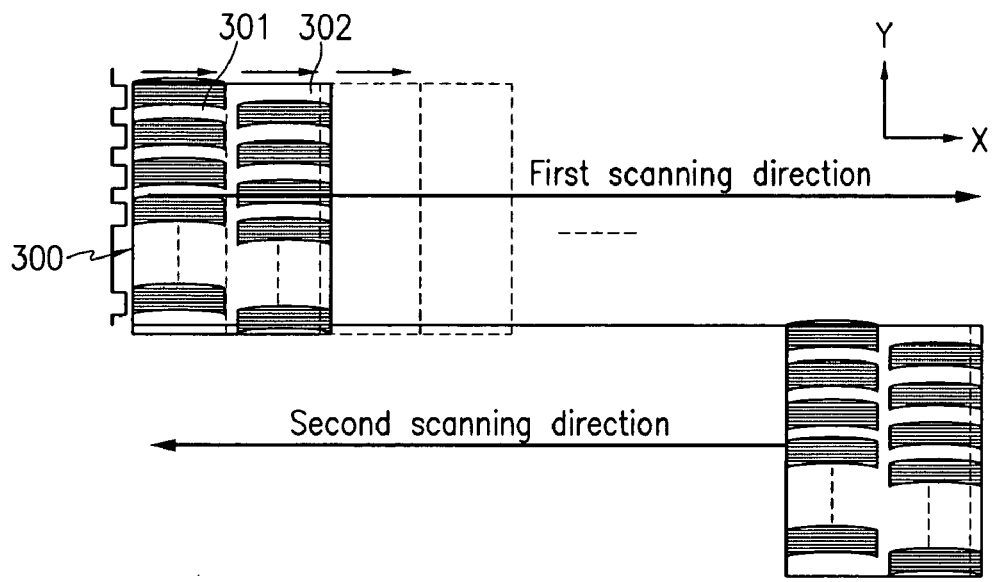
FIG. 18 illustrates processes of a sequential lateral solidification according to an embodiment of the present invention.
Figure 19:
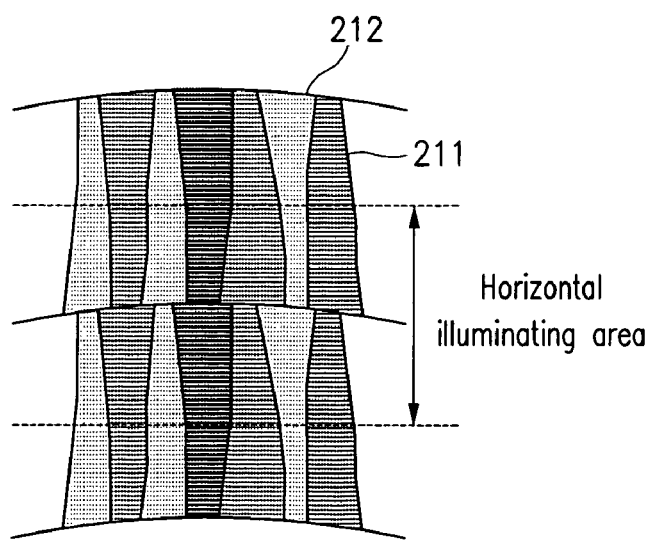
FIG. 19 illustrates crystal grains of polysilicon crystallized by a sequential lateral solidification according to an embodiment of the present invention.

FIG. 16 illustrates crystallizing process of using a mask having slits and illuminating a laser through the silts. FIG. 17 plane view of a mask according to an embodiment of the present invention. FIG. 18 illustrates processes of a sequential lateral solidification according to an embodiment of the present invention. FIG. 19 illustrates crystal grains of polysilicon crystallized by a sequential lateral solidification according to an embodiment of the present invention.

As shown in FIG. 16, an amorphous layer 200 formed on an insulating substrate is partially melted by laser illumination through a mask 300 having slits 310 to form liquid regions corresponding to the slits. Here, the slits 310 of mask 300 that is transparent area of the laser have curved boundary line 312 having shape of an arc. Such a slit shape is for increasing characteristics uniformity of thin film transistors. It will be later described in detail.

The liquid silicon is slowly solidified to become polysilicon. At this time, crystal grains 211 of polysilicon grow from the boundary surface of the liquid regions 210 and solid regions in a vertical direction to the boundary surface of the liquid regions 210 and solid regions. The growth of crystal grains 211 is finished when two growing portions meet each other at the center of the liquid region. As a result, grain groups 212 are formed.

When using the SLS, it is possible to form the main grains in a various size by transferring the mask 300 along the growth direction of the grains 211.

For an example, as shown in FIG. 17, an optic mask 300 has two regions 301 and 302 having the same pattern. Each of the regions 301 and 302 includes a plurality of slits 310 which are arranged in a row and have a regular distance therebetween. The slits are passages of laser beams. Here, the slits of the regions 301 and 302 are arranged to deviate from each other.

As shown in FIG. 18, after one laser illumination (laser shot) is done, the mask 300 is moved to the horizontal (x axis) direction by the width of the regions 301 and 302, and then another laser illumination is performed. Since the slits 310 of the two regions 301 and 302 are arranged to deviate from each other, every portion is illuminated by the laser by the transportation of the mask 300 and illumination of laser.

As shown in FIG. 19, crystal grains 211 of polysilicon grow from the boundary surface of the liquid regions 210 and solid regions in a vertical direction to the boundary surface of the liquid regions 210 and solid regions. The growth of crystal grains 211 is finished when two growing portions meet each other at the center of the liquid region. As a result, grain groups 212 having a curved boundary line the same as the boundary line of the slits 310 are formed.

In this embodiment of the present invention, uniformity of thin film transistors characteristics is increased by forming the grain groups 212 to have a curved shape. This effect will be described with reference to drawings.

Figure 20:
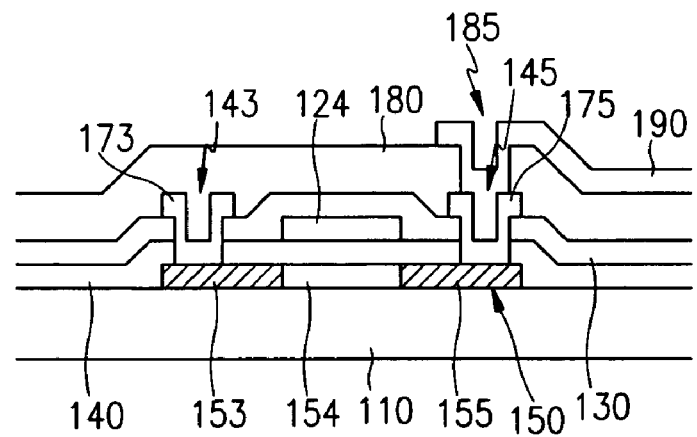
FIG. 20 is a cross-sectional view of a polysilicon thin film transistor array panel according to an embodiment of the present invention.
Figure 21:
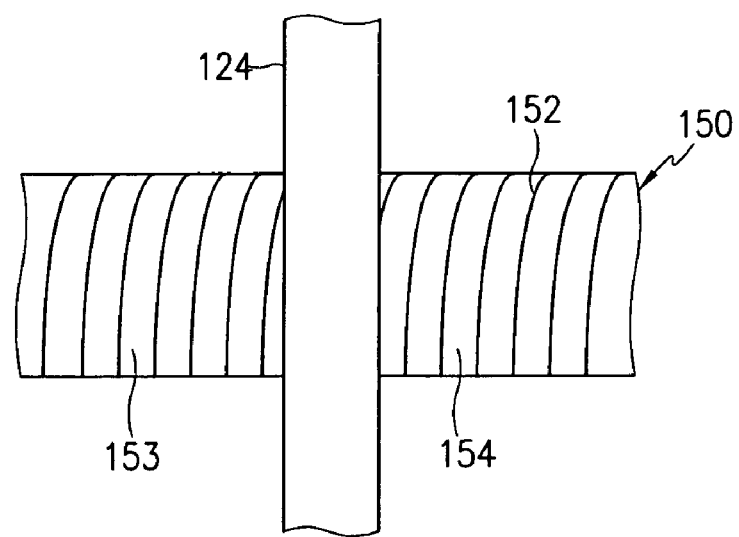
FIG. 21 illustrates structure of grain groups in a step of manufacturing process of a thin film transistor array panel according to an embodiment of the present invention.

FIG. 20 is a cross-sectional view of a polysilicon thin film transistor array panel according to an embodiment of the present invention. FIG. 21 illustrates structure of grain groups in a step of manufacturing process of a thin film transistor array panel according to an embodiment of the present invention. FIGS. 22A to 22E are cross-sectional views illustrating manufacturing process of a polysilicon thin film transistor array panel according to an embodiment of the present invention.

As shown in FIG. 20, a semiconductor layer 150 made of polysilicon and having a channel region 154 and a source and drain regions 153 and 155 disposed on both sides of the channel region 154. Here, as shown FIG. 21, a gate electrode 124 is disposed in the transportation direction of the mask to increase the characteristics of thin film transistors. That is, the channel region 154 disposed between the source region 153 and the drain region 155 is formed to include the least number of the grain groups 152 for enhancing charge mobility.

Since the grain groups 152 have curved boundary, the boundaries of the grain groups 152 are not parallel with the boundary of the channel region 154. Therefore, the grain groups 152 included in the channel region 154 have various widths. Accordingly, no matter where thin film transistors are disposed, the channel regions of the thin film transistors include similar pieces of grain groups. As a result, all of the thin film transistors have similar characteristics.

Here, the source and drain region 153 and 155 are doped with one of n type and p type dopants and may include a silicide layer. Lightly doped drains (LDDs) may be formed between the channel region 154 and the source and drain regions 153 and 155.

A gate insulating layer 140 made of $SiO_2$ or SiNx is formed on the insulating substrate 110 to cover the semiconductor layer 150. A gate electrode 124 connected to a gate line transmitting scanning signals is formed on the gate insulating layer 140 to overlap the channel region 154.

An interlayer insulating layer 130 is formed on the gate insulating layer 140. The interlayer insulating layer 130 and the gate insulating layer 140 have contact holes 143 and 145 respectively exposing the source region 153 and the drain region 154.

A source electrode 173 connected to the source region 153 through the contact hole 143 is formed on the interlayer insulating layer 130. A drain electrode 175 connected to the drain region 155 through the contact hole 145 is formed on the interlayer insulating layer 130.

A passivation layer 180 is formed on the interlayer insulating layer 130 to cover the source and drain electrodes 173 and 175. The passivation layer 180 has a contact hole 185 exposing the drain electrode 175.

A pixel electrode 190 made of a transparent conductive material such as indium tin oxide (ITO) and indium zinc oxide (IZO) or a reflective conductive material is formed on the passivation layer to be connected to the drain electrode 175 through the contact hole 185.

A thin film transistor according the present invention may be used as a switching element for driving a pixel electrode in an LCD or for controlling current in an organic electro-luminescence device.

Now, a method of manufacturing a thin film transistor array panel according to the present invention will be described.

At first, an amorphous silicon layer is deposited on an insulating substrate 110 by one of a plasma enhance chemical vapor deposition, a low pressure chemical vapor deposition, and a sputtering.

Figure 22A:
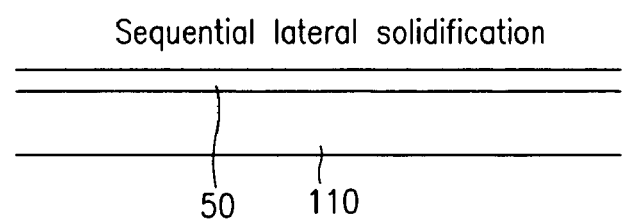
FIGS. 22A to 22E are cross-sectional views illustrating manufacturing process of a polysilicon thin film transistor array panel according to an embodiment of the present invention.

Next, as shown in FIG. 22A, a SLS process is performed to the amorphous silicon layer with using a mask having curved slits to form a polysilicon layer 50 having grain groups. At this time, the silts of the mask have a curved shape to enhance uniformity of thin film transistor characteristics.

Figure 22B:
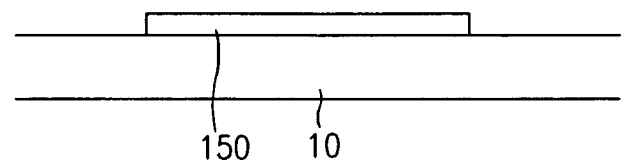

Next, as shown in FIG. 22B, the polysilicon layer 50 is photo-etched to form the semiconductor layer 150.

Figure 22C:
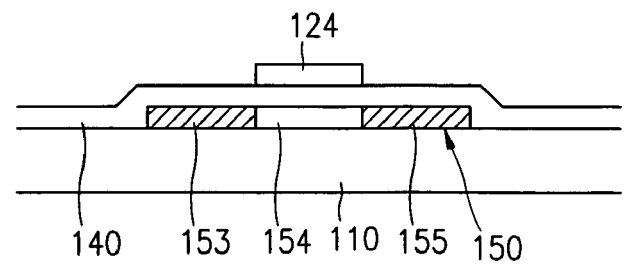

Next, as shown in FIG. 22C, a gate insulating layer 140 is deposited with SiNx or $SiN_2$. A conductive material layer including a low resistance conductive material is deposited on the gate insulating layer 140 and is patterned to form a gate line having a gate electrode 124.

Next, as shown in FIG. 22C, n type or p type dopants are injected in the semiconductor layer 150 by using the gate electrode 124 as a mask and are activated to form a source and drain regions 153 and 155. Here, the portion disposed between the source region 153 and the drain region 155 is defined as a channel region 154. Lightly doped drains (LDDs) may be formed between the channel region 154 and the source and drain regions 153 and 155.

Figure 22D:
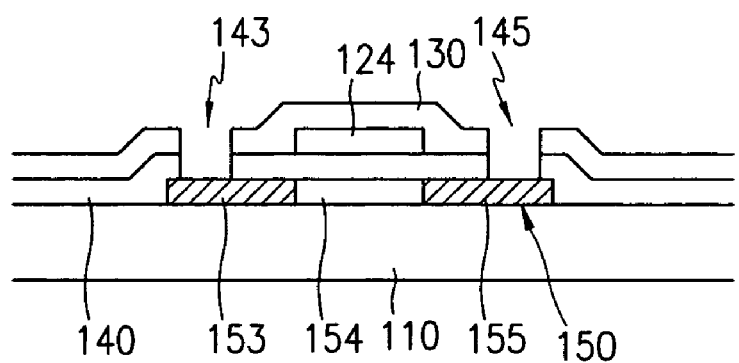

Next, as shown in FIG. 22D, an interlayer insulating layer 130 is formed on the gate insulating layer 140 to cover the gate electrode 124 and is patterned along with the gate insulating layer 140 to form contact holes 143 and 145 respectively exposing the source region 153 and the drain region 155.

Figure 22E:
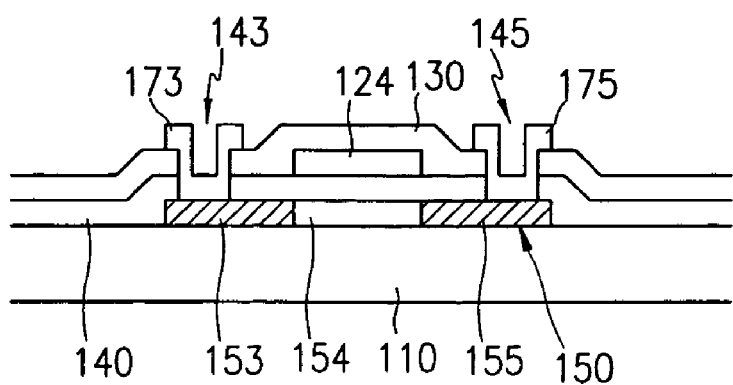

Next, as shown in FIG. 22E, a metal layer is deposited on the interlayer insulating layer 130 and is patterned to form a source and drain electrodes 173 and 175 which are respectively connected to the source region 173 and the drain region 175 through the contact holes 143 and 145. Here, a data line connected to the source electrode 173 and transmitting image signals is generally formed along with the source and drain electrodes 173 and 175.

Next, as shown in FIG. 21, a passivation layer 180 is coated on the source and drain electrodes 173 and 175 and is patterned to form a contact hole 185 exposing the drain electrode 175.

Next, a conductive material of a transparent conductive material such as indium tin oxide (ITO) and indium zinc oxide (IZO) or a reflective conductive material is deposited on the passivation layer 180 and is patterned to form a pixel electrode 190.

As described in the above, the present invention enhances uniformity of thin film transistors characteristics by forming the grain groups to have a curved boundary by using an optic mask having curved slits.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skilled in the art.

What is claimed is:

1. A method of crystallizing amorphous silicon, comprising:
   forming an amorphous silicon layer on an insulating substrate;
   forming a polycrystalline silicon layer by irradiating a laser beam to the amorphous silicon layer through an optic mask which includes a first slit region including a plurality of slits regularly arranged and by transferring the laser beam and the optic mask;
   wherein the plurality of slits are disposed parallel to each other and having regular gaps between the slits,
   wherein the plurality of slits of the first slit region include a first slit having a first length and a second slit having a second length which is longer than the first length, and
   wherein the plurality of slits are formed to slope by a predetermined angle with respect to a direction of transfer of the optic mask.

2. The method of claim 1, further comprising:
   forming a semiconductor layer by patterning the poly silicon layer;
   forming a gate insulating layer over the semiconductor layer;
   forming a gate line on the gate insulating layer to overlap the semiconductor layer partially;
   forming a source region and a drain region by doping conductive impurities of high concentration on predetermined regions of the semiconductor layer;
   forming a first interlayer insulating layer over the gate line and the semiconductor layer;
   forming a data line including a source electrode connected with the source region and a drain electrode connected with the drain region;
   forming a second interlayer insulating layer on the data line and the drain electrode; and
   forming a pixel electrode on the second interlayer insulating layer to be connected with the drain electrode.

3. The method of claim 2, further comprising a step of forming LDD regions in the semiconductor layer by doping conductive impurities having a lower concentration compared to the source region and the drain region.

4. The method of claim 2, further comprising a step of forming a blocking layer between the insulating substrate and the semiconductor layer.

5. The method of claim 1, wherein the step of forming a polycrystalline silicon layer is performed by a SLS and grain groups formed by the SLS have boundaries deviating from the boundary of the channel region.

6. The method of claim 1, wherein the second slit is disposed in an upper portion of the first slit region.

7. The method of claim 1, wherein the second length is longer than the first length by the margin of misalignment of the optic mask.

8. The method of claim 7, wherein the second length is 3-4 μm longer than the first length.

9. The method of claim 1, wherein at least one slit of the plurality of slits has a different size from the other slits.

10. The method of claim 1, wherein the optic mask further includes a second slit region including a plurality of slits regularly arranged, and wherein the slits of the first slit region are arranged to deviate from the slits of the second slit region.

11. The method of claim 1, wherein the plurality of slits of the second slit region have the same shape as the plurality of slits of the first slit region.

12. The method of claim 2, further comprising forming a storage electrode line on the gate insulating layer overlapping the semiconductor layer at least partially.

13. The method of claim 1, further comprising:
   forming a semiconductor layer by patterning the poly silicon layer;
   forming a gate insulating layer over the semiconductor layer;
   forming a gate line overlapping the semiconductor layer partially and a first data metal piece on the gate insulating layer;
   forming a source region and a drain region by doping conductive impurities of high concentration on predetermined regions of the semiconductor layer;
   forming an interlayer insulating layer over the gate line and the data metal piece;
   forming a data connection part on the interlayer insulating layer to be connected with the first data metal piece and the source region;
   forming a pixel electrode on the interlayer insulating layer to be connected with the drain region.

14. The method of claim 13, further comprising a step of forming LDD regions in the semiconductor layer by doping conductive impurities having a lower concentration compared to the source region and the drain region.

15. The method of claim 13, further comprising a step of forming a blocking layer between the insulating substrate and the semiconductor layer.

16. The method of claim 13, further comprising forming a storage electrode line on the gate insulating layer overlapping the semiconductor layer at least partially.

17. The method of claim 13, further comprising forming a second data metal piece on the gate insulating layer, wherein the data connection part connects the first data metal piece and the second data metal piece to each other.

* * * * *